(12) United States Patent
Kan et al.

(10) Patent No.: US 11,294,204 B2
(45) Date of Patent: Apr. 5, 2022

(54) SENSOR MODULE, TEMPLE, FRAME AND EYEWEAR

(71) Applicant: Mitsui Chemicals, Inc., Tokyo (JP)

(72) Inventors: Ryuki Kan, Saijo (JP); Takafumi Ohto, Saijo (JP); Osamu Masuda, Awa (JP)

(73) Assignee: Mitsui Chemicals, Inc., Tokyo (JP)

( * ) Notice: Subject to any disclaimer, the term of this patent is extended or adjusted under 35 U.S.C. 154(b) by 260 days.

(21) Appl. No.: 16/474,193

(22) PCT Filed: Sep. 25, 2017

(86) PCT No.: PCT/JP2017/034404
§ 371 (c)(1),
(2) Date: Jun. 27, 2019

(87) PCT Pub. No.: WO2018/123170
PCT Pub. Date: Jul. 5, 2018

(65) Prior Publication Data
US 2019/0346697 A1    Nov. 14, 2019

(30) Foreign Application Priority Data
Dec. 27, 2016 (JP) .............................. JP2016-253272

(51) Int. Cl.
*G02C 1/00* (2006.01)
*G02C 11/00* (2006.01)
(Continued)

(52) U.S. Cl.
CPC .............. *G02C 11/10* (2013.01); *G02C 7/083* (2013.01); *G06F 3/044* (2013.01)

(58) Field of Classification Search
CPC . G02C 1/00; G02C 5/00; G02C 11/10; G02C 7/083; G02C 7/08; G02C 5/14; G02C 7/02; G06F 3/044; G06F 3/02
(Continued)

(56) References Cited

U.S. PATENT DOCUMENTS
2010/0177277 A1    7/2010 Kokonaski et al.
2012/0212890 A1    8/2012 Hoshino et al.
(Continued)

FOREIGN PATENT DOCUMENTS
JP    2008-282724 A    11/2008
JP    2012514773 A    6/2012
JP    2012-174053 A    9/2012

OTHER PUBLICATIONS

International Search Report from International Application No. PCT/JP2017/034404 dated Nov. 28, 2017.
Extended European Search Report dated Jul. 9, 2020.

*Primary Examiner* — Cara E Rakowski
*Assistant Examiner* — Hung X Dang
(74) *Attorney, Agent, or Firm* — Brundidge & Stanger, P.C.

(57) ABSTRACT

Provided is a sensor module that includes: a casing; a contacted part that is disposed so that at least a part thereof is exposed to the outside of the casing and that has conductivity; and a detection part that has an electrostatic capacitance type detection pad and that is disposed inside the casing. The detection part further includes a conductive plate provided so as to correspond to the detection region of the detection pad, the contacted part being electrically connected to the conductive plate. This configuration makes it possible to provide a sensor module that is highly sensitive to contact with an object, and that prevents damage to the detection pad caused by contact with the object.

19 Claims, 27 Drawing Sheets

(51) Int. Cl.
*G02C 7/08* (2006.01)
*G06F 3/044* (2006.01)

(58) Field of Classification Search
USPC .............................. 351/158, 111, 41; 349/13
See application file for complete search history.

(56) References Cited

U.S. PATENT DOCUMENTS

| | | |
|---|---|---|
| 2012/0217982 A1 | 8/2012 | Narayanasamy |
| 2013/0250233 A1* | 9/2013 | Blum .................... G02C 11/10 351/158 |
| 2015/0062022 A1 | 3/2015 | Rabii |
| 2015/0092124 A1 | 4/2015 | Haruyama |

* cited by examiner

SENSOR MODULE, TEMPLE, FRAME AND EYEWEAR

TECHNICAL FIELD

The present invention relates to a sensor module, a temple for eyewear having the sensor module, a frame for eyewear, and an eyewear.

BACKGROUND ART

In electronic equipment such as a smartphone or a car navigator, a graphical user interface (GUI) can be adopted as an input section to be operated by a user. Examples of the input section include a sensor module having a touch sensor (detection pad). As the sensor module, a sensor module having a capacitive touch sensor is known (see Patent Literature (hereinafter, abbreviated as PTL) 1, for example).

The sensor module described in PTL 1 has a touch sensor and a cover member covering at least a part of the touch sensor. This makes it possible to prevent damage on the touch sensor due to contact of an object such as the finger of the user, and detect the contact of the object based on a capacitance change that occurs between the object and the touch sensor when the object comes into contact with the cover member.

CITATION LIST

Patent Literature

PTL 1
Japanese Patent Application Laid-Open No. 2012-174053

SUMMARY OF INVENTION

Technical Problem

However, in the sensor module described in PTL 1, the cover member is disposed between the touch sensor and the object, thereby causing a problem where an amount of change in capacitance caused by the contact of the object is small, resulting in deterioration in sensitivity of the sensor module. Hence there is a room for improvement from the viewpoint of enhancing the sensitivity of the sensor module.

An object of the present invention is to provide a sensor module, a temple for eyewear, a frame for eyewear, and an eyewear, the sensor module having high sensitivity for contact of the object while preventing damage on a detection pad caused by the contact of the object.

Solution to Problem

A sensor module according to the present invention includes: a casing; a contacted section that has conductivity and is disposed such that at least a part of the contacted section is exposed to an outside of the casing; and a detection section that includes a capacitive detection pad and is disposed inside the casing, in which: the detection section further includes a conductive plate provided corresponding to a detection region of the detection pad, and the contacted section is electrically connected to the conductive plate.

A temple according to the present invention is a temple for eyewear, the temple including the sensor module according to the present invention, in which: the casing constitutes an outer shape of the temple, and at least a part of the contacted section is disposed so as to be exposed to an outside of the temple.

A frame according to the present invention is a frame for eyewear, the frame including: a front configured to hold a pair of lenses; and the temple according to the present invention, connected to the front.

An eyewear according to the present invention includes: a pair of lenses each including an electroactive region in which an optical characteristic changes by electric control; the frame according to the present invention, holding the pair of lens; and a control section configured to vary the optical characteristic in the electroactive region of each of the pair of lenses by applying a voltage to the pair of lenses or stopping application of the voltage to the pair of lenses when the detection section detects contact of the object with the contacted section.

Advantageous Effects of Invention

According to the present invention, it is possible to provide a sensor module, a temple for eyewear, a frame for eyewear, and eyewear, the sensor module having high sensitivity for contact of the object while preventing damage on a detection pad caused by the contact of the object.

DESCRIPTION OF EMBODIMENTS

Hereinafter, embodiments of the present invention will be described with reference to the drawings. In the following, electronic glasses will be described as a representative example of the eyewear according to the present invention, the electronic glasses having lenses that include electroactive regions capable of changing optical characteristics of the lenses by electric control. Further, as a representative example of the sensor module according to the present invention, temples for the electronic glasses will be described.

Embodiment 1

(Configuration of Electronic Glasses)

Figure 1:
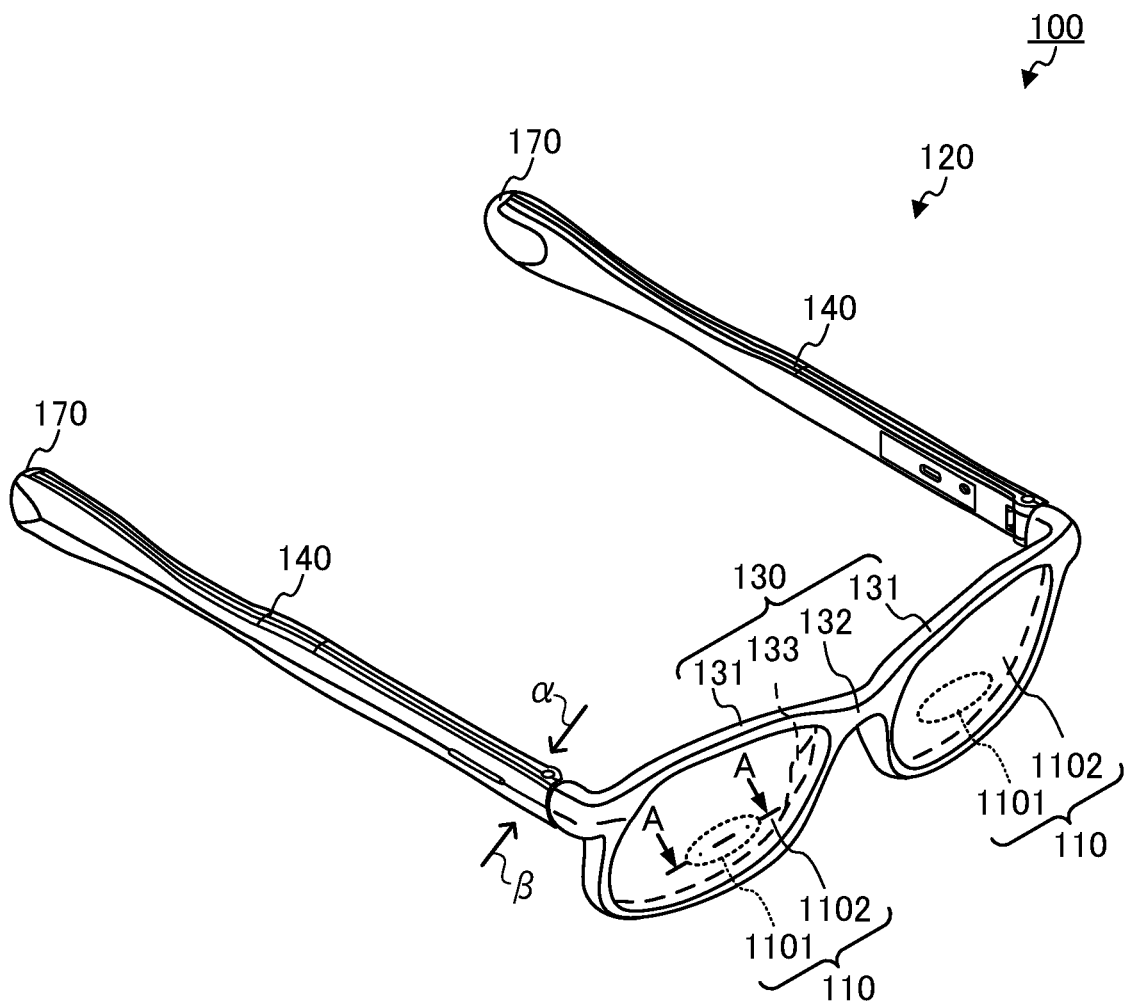
FIG. 1 is a perspective view illustrating an example of a configuration of electronic glasses according to Embodiment 1.
Figure 2:
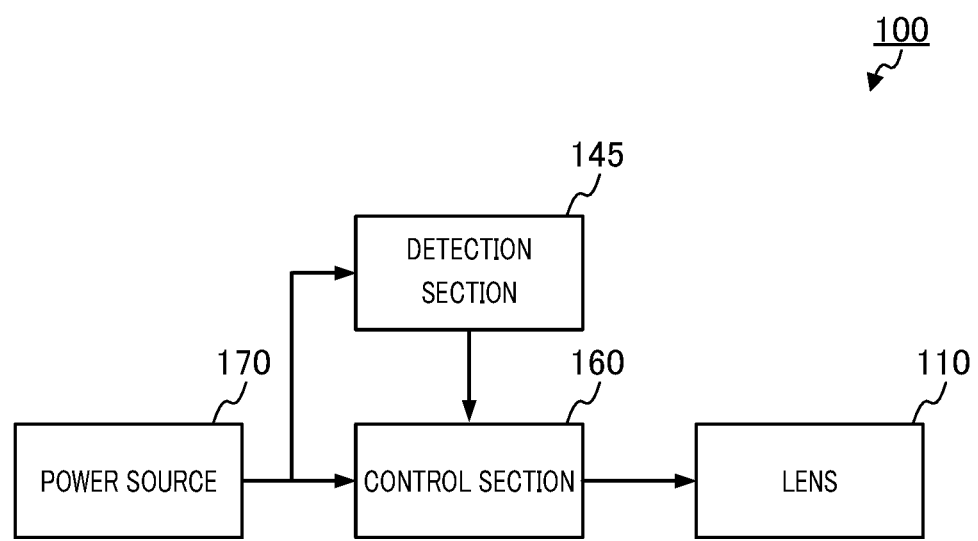
FIG. 2 is a block diagram illustrating an internal circuit of electronic glasses according to each of Embodiments 1 to 4.

FIG. 1 is a perspective view illustrating an example of a configuration of electronic glasses 100 according to the present embodiment. FIG. 2 is a block diagram illustrating an internal circuit of electronic glasses 100 according to the present embodiment. Electronic glasses 100 have a pair of lenses 110, frame 120, control section 160 (see FIG. 2), and power source 170. Frame 120 has front 130 and a pair of temples 140. In the following, a portion where front 130 is disposed will be described as the front of electronic glasses 100. In the following description, when a "front-rear direction", a "width direction", and a "vertical direction" are mentioned without specific explanation, these mean the respective directions of electronic glasses 100 in an opened state (the state illustrated in FIG. 1) where a user can wear electronic glasses 100 as glasses. Specifically, the front-rear direction of electronic glasses 100 is the front-rear direction of the user when wearing the glasses. The width direction of electronic glasses 100 is the lateral direction of the user when wearing the glasses. The vertical direction of electronic glasses 100 is the perpendicular direction of the user when wearing the glasses.

1) Lens

Figure 3:
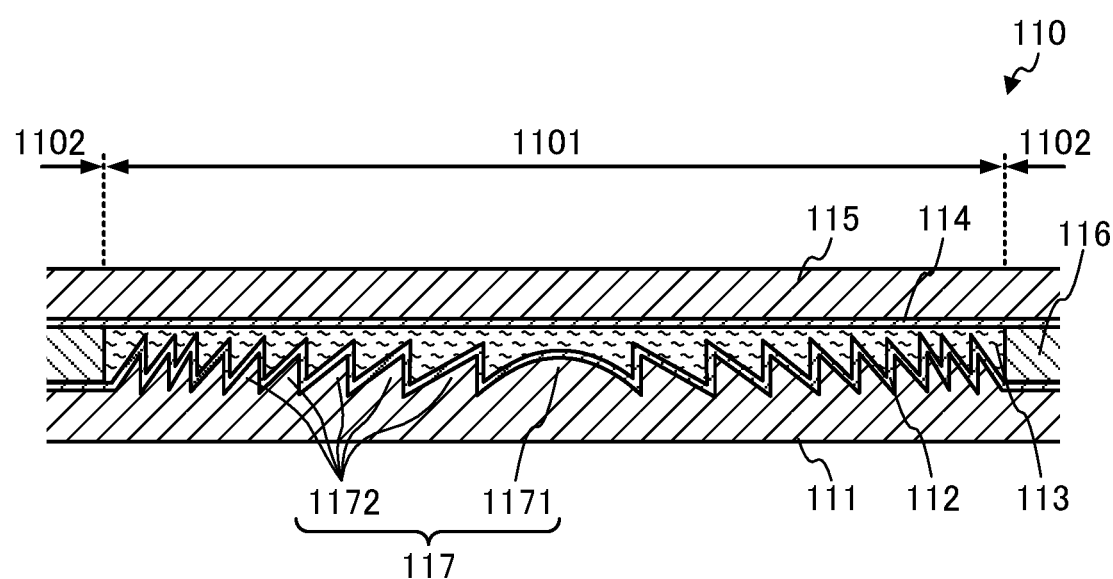
FIG. 3 is a sectional schematic view for explaining an example of a configuration of a lens.

FIG. 3 is a sectional schematic view for explaining an example of a configuration of lens 110. FIG. 3 is a sectional view along a line A-A in FIG. 1. Note that FIG. 3 illustrates the configuration of lens 110 with a curvature of lens 110 set to zero.

Note that the pair of lenses 110 are formed so as to be almost symmetrical in a front view of electronic glasses 100 and have components being the same as each other. Therefore, in the following, lens 110 for right eye in electronic glasses 100 will be described, and the description of the components of the configuration of lens 110 for left eye will be omitted.

Lens 110 has first region (electroactive region) 1101 where a focal length (power) that is variable with the voltage, and second region 1102 placed in a region except for first region 1101. Lens 110 may be a spherical lens or an aspherical lens. The shape of lens 110 can be adjusted as appropriate in accordance with expected optical power.

The shape, size, and position of first region 1101 can be designed as appropriate in accordance with the size of lens 110, the use of lens 110, and the like. Examples of the use of lens 110 include a near-and-far bifocal lens, a near-and-mid bifocal lens, and near-and-near bifocal lens. Examples of the shape of first region 1101 include a circular shape and an elliptical shape. In the present embodiment, the shape of first region 1101 is an elliptical shape with the lateral direction (also referred to as the width direction) of electronic glasses 100 taken as a long axis. As illustrated in FIG. 1, first region 1101 is placed below the center of lens 110 in a front view of lens 110.

As illustrated in FIG. 3, first region 1101 has first substrate 111, first electrode 112, liquid crystal layer 113, second electrode 114, and second substrate 115 in order from the rear side (the lower side in FIG. 3). Second region 1102 has first substrate 111, first electrode 112, adhesive layer 116, second electrode 114, and second substrate 115 in order from the rear side. Each of the components has translucency to visible light.

First substrate 111 is disposed on the rear side (the user side) of lens 110 in electronic glasses 100. First substrate 111 is curved toward the front side of electronic glasses 100 so as to have a protruding shape. The curvature and shape of first substrate 111 can be adjusted as appropriate in accordance with the expected optical power.

First substrate 111 includes diffraction region 117 placed in a region corresponding to first region 1101. On one surface (front-side surface) of first substrate 111, diffraction region 117 is formed with spherical protrusion 1171 disposed at the center portion and a plurality of first protruding strips 1172 in an annular shape arranged on the outside of protrusion 1171. The shapes of protrusion 1171 and first protruding strips 1172 can be adjusted as appropriate in accordance with the expected optical power at the time of diffracting light incident from the front of electronic glasses 100. Examples of the shapes of protrusion 1171 and first protruding strips 1172 include a Fresnel-lens shape. Some of protrusion 1171 and first protruding strips 1172 may have the Fresnel-lens shape, or all of protrusion 1171 and first protruding strips 1172 may have the Fresnel-lens shape.

A material for first substrate 111 is not particularly limited so long as having translucency. For example, as the material for first substrate 111, a known material usable as a material for a lens can be used. Examples of the material for first substrate 111 include glass and resin. Examples of the resin include polymethyl methacrylate, polycarbonate, polydiethyleneglycol bis allylcarbonate, and polystyrene.

First electrode 112 and second electrode 114 are a pair of transparent electrodes having translucency. First electrode 112 is disposed between first substrate 111 and liquid crystal layer 113. Second electrode 114 is disposed between liquid crystal layer 113 and second substrate 115. First electrode 112 and second electrode 114 may only be disposed at least over a range (first region 1101) where the voltage can be applied to liquid crystal layer 113.

The material for each of first electrode 112 and second electrode 114 is not particularly limited so long as having expected translucency and conductivity. Examples of the material for each of first electrode 112 and second electrode 114 include Indium tin oxide (ITO) and zinc oxide (ZnO). The material for first electrode 112 and the material for second electrode 114 may be the same as or different from each other.

Liquid crystal layer 113 is disposed between first electrode 112 and second electrode 114. Liquid crystal layer 113 is configured so as to change its refractive index in accordance with application or non-application of the voltage. Although described in detail later, for example, in a state where no voltage is being applied to liquid crystal layer 113, the refractive index of liquid crystal layer 113 is almost the same as the refractive index of first substrate 111 and the refractive index of second substrate 115, and in a state where the voltage is being applied to liquid crystal layer 113, the refractive index of liquid crystal layer 113 can be adjusted so as to be different from the refractive index of first substrate 111 and the refractive index of second substrate 115.

Liquid crystal layer 113 contains a liquid crystal material. The oriented state of the liquid crystal material at the time when the voltage is being applied and the oriented state of the liquid crystal material at the time when no voltage is being applied are different from each other. The liquid crystal material can be selected as appropriate in accordance with the refractive index of first substrate 111 and the refractive index of second substrate 115. For example, the liquid crystal material can be made of cholesteric liquid crystal or nematic liquid crystal.

Second substrate 115 is disposed on the front side of lens 110 in electronic glasses 100. Second substrate 115 is also curved toward the front side of electronic glasses 100 so as to have a protruding shape. The curvature of second substrate 115 corresponds to the curvature of first substrate 111. Examples of a material for second substrate 115 are the same as the examples of the material for first substrate 111.

Adhesive layer 116 is disposed between first substrate 111 and second substrate 115 in second region 1102 and makes first substrate 111 and second substrate 115 adhere each other. When first electrode 112 and second electrode 114 are also arranged in second region 1102, adhesive layer 116 is disposed between first electrode 112 and second electrode 114. Adhesive layer 116 also has a function to seal the liquid crystal material constituting liquid crystal layer 113.

Adhesive layer 116 is made of a hardened material of an adhesive. A material for the adhesive is not particularly limited so long as having expected translucency and being able to appropriately make first substrate 111 and second substrate 115 adhere to each other. From the viewpoint of adjusting optical power of lens 110, an adhesive having an expected refractive index can be selected.

Lens 110 may further have another component having translucency according to the need. Examples of another component include an insulating layer and an oriented film.

The insulating layer prevents conduction between first electrode 112 and second electrode 114. For example, the respective insulating layers are disposed between first electrode 112 and liquid crystal layer 113 and between liquid crystal layer 113 and second electrode 114. As a material for the insulating layer, a known material usable as an insulating layer having translucency can be used. Examples of the material for the insulating layer include silicon dioxide.

The oriented film controls the oriented state of the liquid crystal material in liquid crystal layer 113. For example, the respective oriented films are disposed between first electrode 112 and liquid crystal layer 113 and between liquid crystal layer 113 and second electrode 114. As a material for the oriented film, a known material usable as an oriented film of the liquid crystal material can be used. Examples of the material for the oriented film include polyimide.

Lens 110 can be manufactured by the following manufacturing method, for example. First, first substrate 111 and second substrate 115 are prepared. First substrate 111 and second substrate 115 can be manufactured by injection molding, for example. Next, first electrode 112 is formed on first substrate 111, and second electrode 114 is formed on second substrate 115. Examples of a method for forming first electrode 112 on first substrate 111 and a method for forming second electrode 114 on second substrate 115 include vacuum evaporation and sputtering. Subsequently, the liquid crystal material is provided onto diffraction region 117 of first substrate 111 where first electrode 112 has been formed, and the adhesive is provided to a portion except for diffraction region 117 of first substrate 111. With the liquid crystal material and the adhesive disposed on first substrate 111, second substrate 115 formed with second electrode 114 is disposed on first substrate 111. Finally, the adhesive is hardened, so that lens 110 can be manufactured.

2) Front

As illustrated in FIG. 1, front 130 holds a pair of lenses 110. Front 130 has a pair of rims 131 respectively supporting the pair of lenses 110, and a bridge 132 connecting between the pair of rims 131 in the width direction. The shape of rim 131 is a shape corresponding to the shape of lens 110. Bridge 132 has a pair of nose pads 133 that can come into contact with the nose of the user. Although not particularly illustrated, wiring is disposed inside front 130, the wiring being configured to electrically connect between first electrode 112 of lens 110 and control section 160 to be described later and electrically connect between second electrode 114 of lens 110 and control section 160.

A material for front 130 is not particularly limited. As the material for front 130, a known material to be used as a material for the front of glasses can be used. Examples of the material for front 130 include polyamide, acetate, carbon, celluloid, polyetherimide, and urethane.

3) Temple

Figure 4:
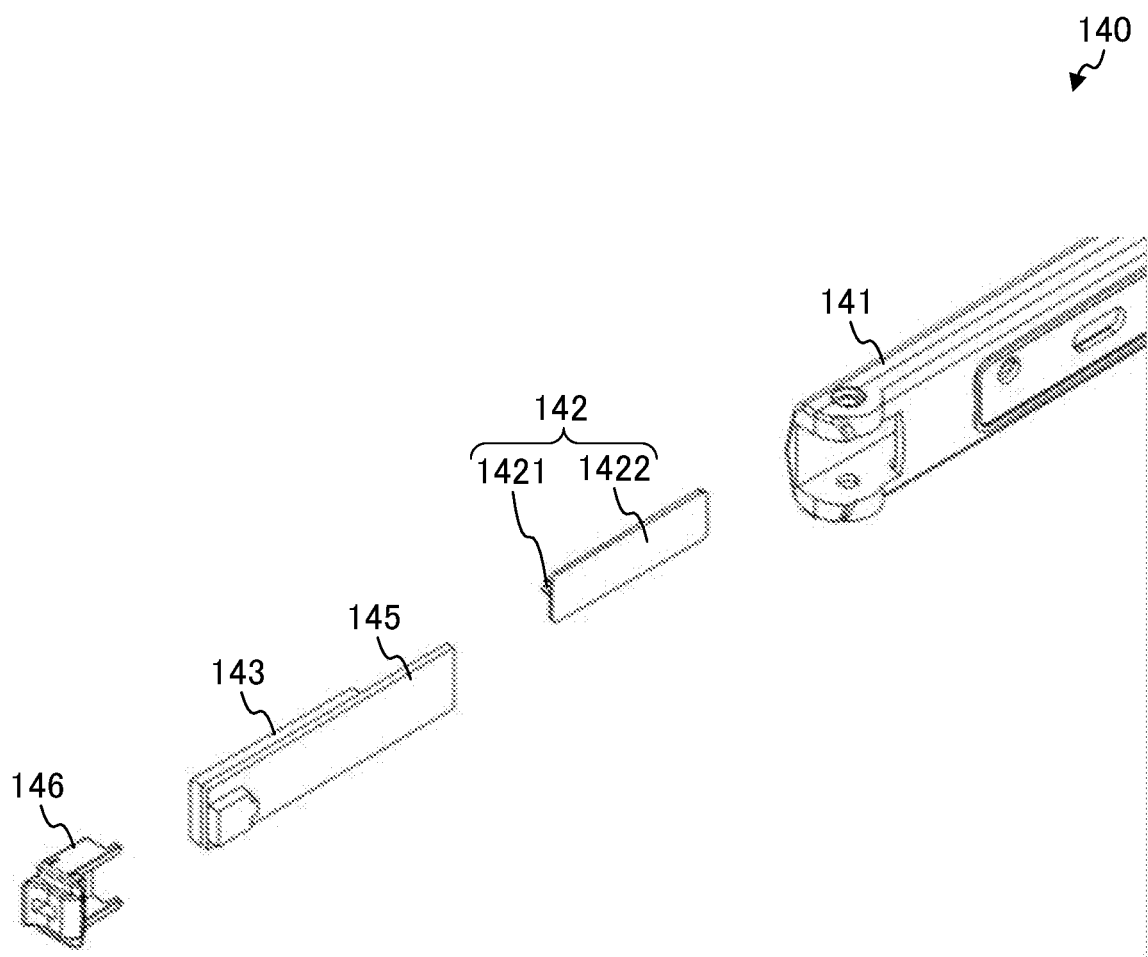
FIG. 4 is an exploded view illustrating an example of a configuration of a front end of a temple according to Embodiment 1.
Figure 5A:
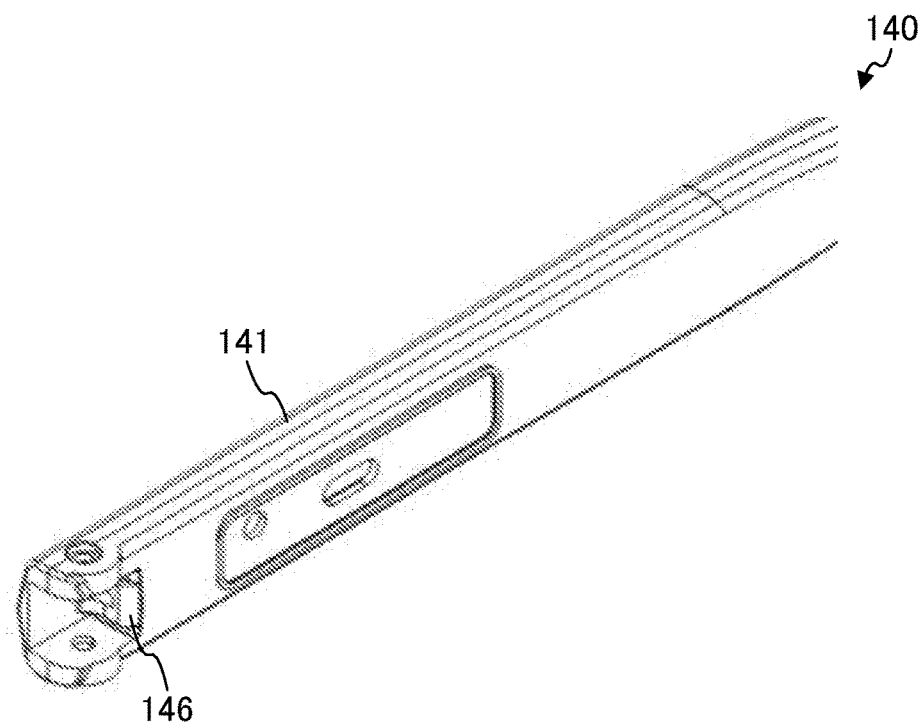
FIGS. 5A and 5B are partially enlarged perspective views illustrating an example of the configuration of the front end of the temple according to Embodiment 1.
Figure 5B:
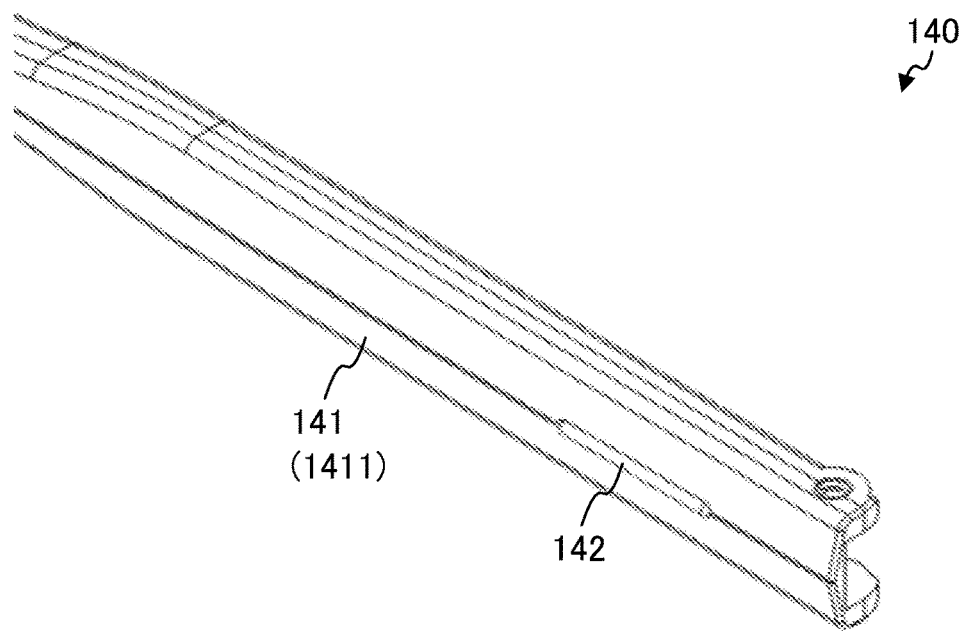
Figure 6A:
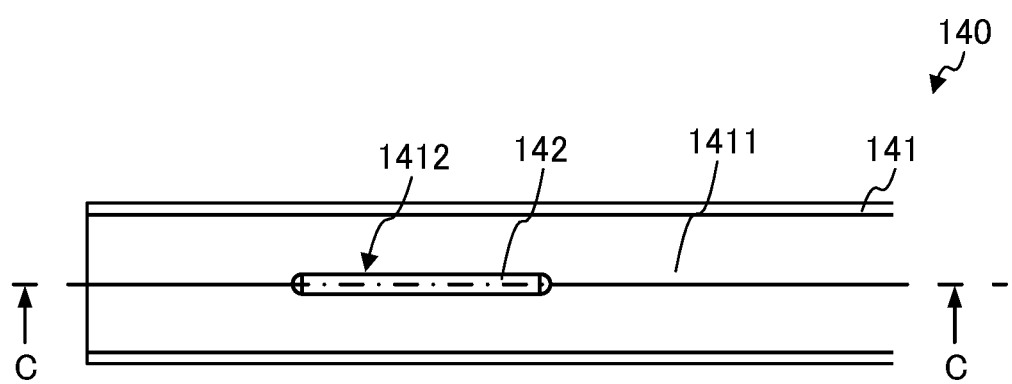
FIGS. 6A to 6C are partial enlarged views illustrating an example of the configuration of the front end of the temple according to Embodiment 1.
Figure 6B:
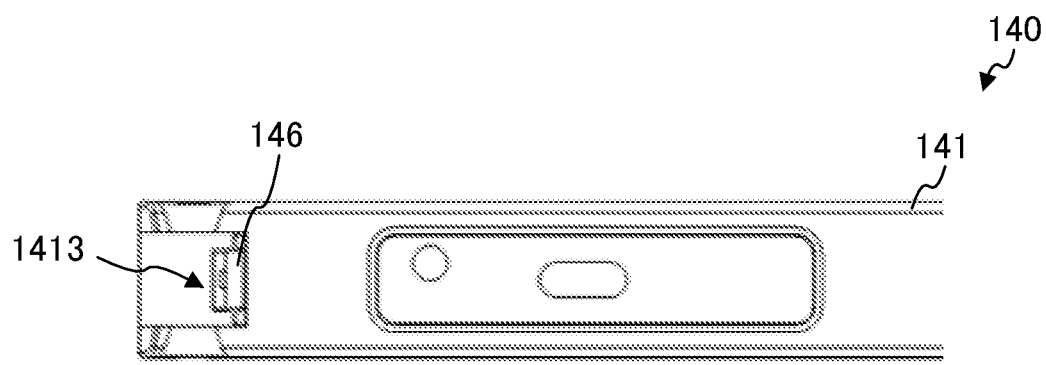
Figure 6C:
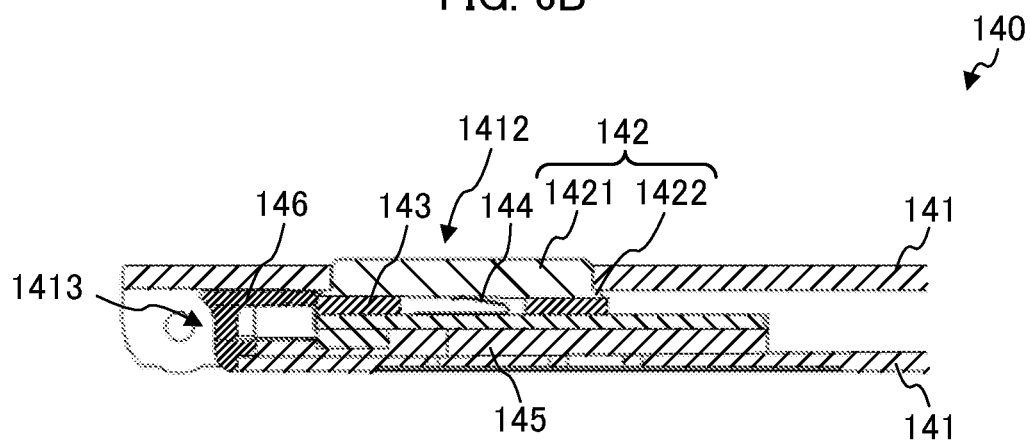

FIG. 4 is an exploded view illustrating an example of a configuration of a front end of temple 140. In the following description of temple 140 as well, when the "width direction", the "front-rear direction", and the "vertical direction" are mentioned without specific explanation, these mean the respective directions in an opened state (specifically, the state illustrated in FIG. 1) where temple 140 has opened to front 130. FIG. 4 is a partial enlarged view of a state in which the front end of temple 140 (left-side temple 140 in FIG. 1) disposed on the right side of the user in a glasses-wearing state (also referred to as one side in the width direction) is seen from the inside in the width direction (a direction of arrow α in FIG. 1). FIGS. 5A and 5B are partially enlarged perspective views illustrating an example of the configuration of the front end of temple 140. FIG. 5A is a partially enlarged perspective view illustrating an example of the configuration of the front end of temple 140 as seen from the inside in the width direction of electronic glasses 100 (the direction of arrow α in FIG. 1), and FIG. 5B is a partially enlarged perspective view illustrating an example of the configuration of the front end of temple 140 as seen from the outside in the width direction of electronic glasses 100 (a direction of arrow β in FIG. 1) FIGS. 6A to 6C are partial enlarged views illustrating an example of the configuration of the front end of temple 140. FIG. 6A is a left-side view (the outer-side view in the width direction) of the front end of temple 140, FIG. 6B is a right-side view (the inner-side view in the width direction) of the front end of temple 140, and FIG. 6C is a sectional view cut along a line C-C in FIG. 6A.

Note that the pair of temples 140 are formed so as to be almost symmetrical in electronic glasses 100 and have components being the same as each other. Therefore, in the following, temple 140 for the right side (disposed on the right side of the user in the glasses-wearing state) will be described, and components of temple 140 for the left side (disposed on the left side of the user in the glasses-wearing state) will be provided with the same numerals as those of components of temple 140 for the right side, and the description of temple 140 for the left side will be omitted.

As illustrated in FIGS. 4, 5A, 5B, and 6A to 6C, temple 140 has casing 141, contacted section 142, spacer 143, elastic member 144, detection section 145, and front-end cover 146. Although described in detail later, detection section 145 has capacitive detection pad 153. For example, detection pad 153 is an electrode layer, and by detecting the capacitance change of the electrode layer caused by contact with contacted section 142, detection pad 153 is connected to a sensing section (not illustrated) that senses the contact with contacted section 142.

As illustrated in FIG. 1, temple 140 is connected to front 130 at the front end thereof. For example, temple 140 is rotatably engaged with rim 131 of front 130.

Casing 141 constitutes the outer shape of temple 140. Casing 141 stores a part of contacted section 142, spacer 143, elastic member 144, and detection section 145. Casing 141 extends along one direction (specifically, the front-rear direction). In the present embodiment, second protruding strip 1411 extends along the longitudinal direction of casing 141 is formed on the left-side surface of casing 141 (also referred to as the outer surface in the width direction of electronic glasses 100) (see FIG. 5B). Further, a short-directional (in other words, vertical) middle point of the outer surface of casing 141 is located on the ridge of second protruding strip 1411. The shape of the right-side surface of casing 141 (also referred to as the inner surface in the width direction of electronic glasses 100) is a planar shape. Hereinafter, in the description of temple 140 and each member constituting temple 140, the outer surface in the width direction of electronic glasses 100 is simply referred to as the "outer surface". Meanwhile, in the description of temple 140 and each member constituting temple 140, the inner surface in the width direction of electronic glasses 100 is simply referred to as the "inner surface." The surface located on the side of the wearer who is wearing electronic glasses 100 can also be referred to as the inner surface, and the surface on the opposite side to the inner surface located on the side of the wearer is located can also be referred to as the outer surface.

First opening 1412 having an elongated shape along the longitudinal direction of casing 141 is formed on the outer surface of the front end of casing 141 (see FIGS. 6A and 6C). First opening 1412 is formed on the extended line of the ridge (top) of second protruding strip 1411. Further, second opening 1413 is formed on the front end (front surface) of casing 141 (see FIGS. 6B and 6C). Note that a third opening (not illustrated) is formed at the rear end (also referred to as the back surface) of casing 141. Power source 170 is removably disposed at the third opening (see FIG. 1).

A material for casing 141 is not particularly limited. As the material for casing 141, a known material being used as a material for the temples of glasses can be used. Examples of the material for casing 141 are the same as the examples of the material for front 130. However, in the case of using a metallic material for casing 141, a portion of casing 141 is made of nonmetallic material, the portion being located on the periphery of contacted section 142 and being in contact (or being able to come into contact) with contacted section 142.

Contacted section 142 is a portion with which an object such as the finger of the user of electronic glasses 100 can come into contact. Hence at least a part of contacted section 142 is disposed so as to be exposed to the outside of casing 141. In the present embodiment, contacted section 142 is disposed such that a part of contacted section 142 is exposed from first opening 1412 to the outside (also referred to the outside in the width direction) of casing 141.

The position of contacted section 142 is preferably positioned such that the user of electronic glasses 100 easily touch contacted section 142. From such a perspective, contacted section 142 is preferably disposed on the front side of a middle point in a longitudinal direction of casing 141, and more preferably disposed in the foremost-side portion when casing 141 is divided into three in the longitudinal direction of casing 141. Further, contacted section 142 is preferably disposed on the extended line of the ridge of second protruding strip 1411. Moreover, contacted section 142 is preferably disposed in a position corresponding to the outer surface of electronic glasses 100.

The shape of contacted section 142 is not particularly limited. In the present embodiment, contacted section 142 is extended along the longitudinal direction of casing 141. Contacted section 142 has exposed portion 1421 exposed from first opening 1412 to the outside of casing 141, and stored portion 1422 stored inside casing 141. For example, exposed portion 1421 has the shape of a stick, and stored portion 1422 has the shape of a plate. Such exposed portion 1421 is exposed from first opening 1412 to the outside of casing 141 in the width direction.

The contact of the object being a conductor with contacted section 142 is electrically transmitted to detection section 145. Contacted section 142 has conductivity from the viewpoint of electrically connecting between contacted section 142 and detection section 145. Examples of a material for contacted section 142 include gold, silver, copper, aluminum, iron, and an alloy of these.

The size of contacted section 142 can be determined in accordance with the size of casing 141, the size of elastic member 144, and the size of detection pad 153 in detection section 145. For example, the length of contacted section 142 in the longitudinal direction of casing 141 is smaller than the length of the detection region of detection pad 153 in the longitudinal direction of casing 141.

Figure 7:
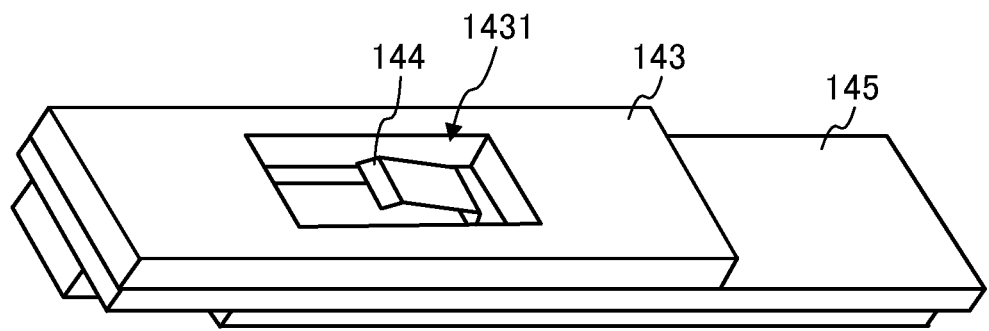
FIG. 7 is a perspective view for explaining an example of positional relationship of a spacer, an elastic member, and a detection section.

FIG. 7 is a perspective view for explaining an example of positional relationship of spacer 143, elastic member 144, and detection section 145. Spacer 143 is disposed between contacted section 142 and detection section 145. In the present embodiment, spacer 143 is disposed between contacted section 142 and conductive plate 148 to be described later. In other words, contacted section 142, spacer 143, and detection section 145 (specifically, conductive plate 148) are disposed in order from the outside in the width direction. Spacer 143 has insulating properties. The shape and size of spacer 143 are not particularly limited so long as an appropriate space corresponding to the size of elastic member 144 can be formed. In the present embodiment, spacer 143 is a plate-like member, at the center of which through hole 1431 having a rectangular columnar shape is formed.

Elastic member 144 has elasticity and conductivity. Elastic member 144 is disposed between contacted section 142 and detection section 145 so as to electrically connect between contacted section 142 and detection section 145 and urge contacted section 142 to the outside (specifically, the outside in the width direction) of casing 141. Thereby, elastic member 144 can electrically connect between contacted section 142 and detection section 145 in an appropriate manner while preventing positional displacement of contacted section 142. In the present embodiment, elastic member 144 is disposed so as to abut on the center of contacted section 142 in through hole 1431 of spacer 143. More specifically, a part of elastic member 144 is disposed in through hole 1431 of spacer 143.

Elastic member 144 may only be able to exert the above function. In the present embodiment, elastic member 144 is a flat spring. Elastic member 144 has conductivity from the viewpoint of electrically connecting between contacted section 142 and detection section 145. Examples of a material for elastic member 144 include gold, silver, copper, aluminum, iron, and an alloy of these.

Figure 8A:
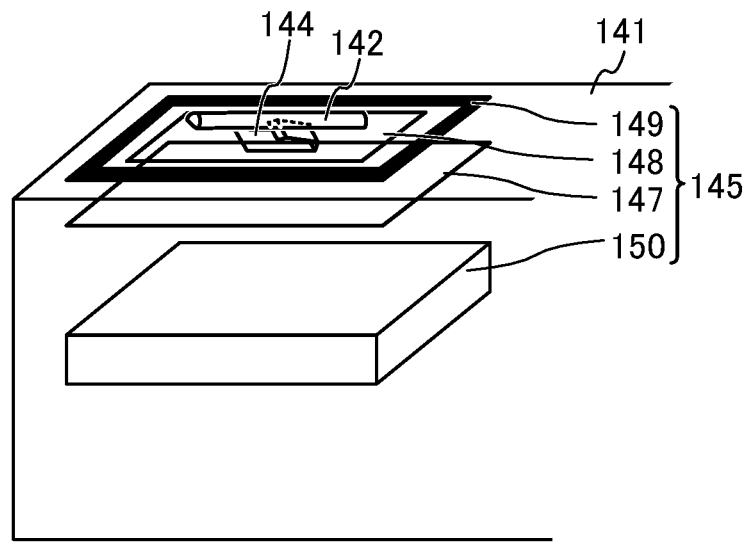
FIGS. 8A and 8B are schematic views for explaining the configuration of the detection section.
Figure 8B:
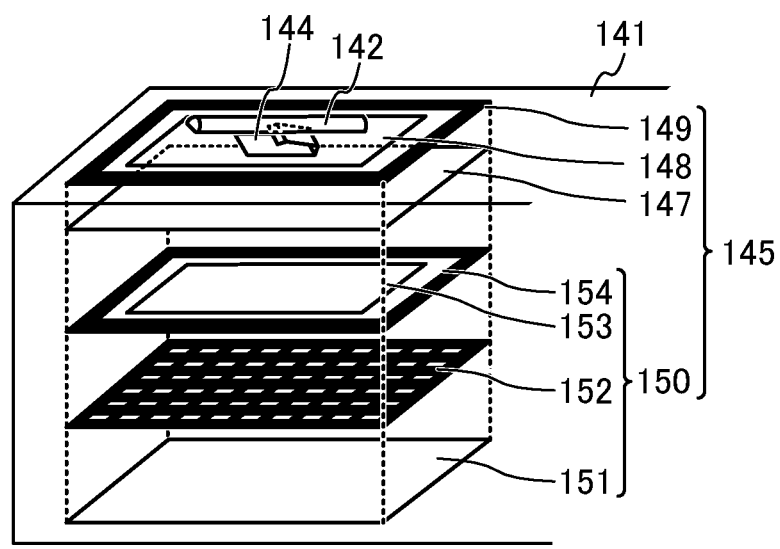

FIGS. 8A and 8B are schematic views for explaining the configuration of detection section 145. FIG. 8A is a schematic view for explaining the outline of the configuration of detection section 145, and FIG. 8B is a schematic view for explaining a detailed configuration of detection section 145.

Detection section 145 is disposed inside casing 141. In detection section 145, a capacitance change occurs caused by contact between the object and contacted section 142. As illustrated in FIG. 8A, detection section 145 has detecting laminate 150, insulating layer 147, conductive plate 148, and first ground portion 149 in order from the inside in the width direction (the lower side in FIG. 8A).

Although described in detail later, detecting laminate 150 has capacitive detection pad 153. Detecting laminate 150 detects a capacitance change that occurs due to the contact between the object and contacted section 142.

Insulating layer 147 is disposed on detecting laminate 150. More specifically, insulating layer 147 is disposed on the detection region of detection pad 153 and prevents conduction between detection pad 153 and conductive plate 148. Here, the detection region of detection pad 153 means a region in which the capacitance change can occur when the object comes into direct contact with detection pad 153.

The configuration of insulating layer 147 is not particularly limited so long as having the above function. Insulating layer 147 may be made of an insulator or may be an air layer. Insulating layer 147 may have a single-layer structure or a laminated structure. Examples of a material for the insulator include silicon dioxide and silicon nitride. In the present embodiment, insulating layer 147 is the insulator. Both end faces of insulating layer 147 are bonded to detection pad 153 and conductive plate 148, respectively. Specifically, the outer surface (the upper surface in FIGS. 8A and 8B) of insulating layer 147 is bonded to conductive plate 148. Meanwhile, the inner surface (the lower surface in FIGS. 8A and 8B) of insulating layer 147 is bonded to detection pad 153.

Conductive plate 148 is disposed on insulating layer 147 (in other words, the outer surface of insulating layer 147). More specifically, conductive plate 148 is disposed so as to face the detection region of detection pad 153 with insulating layer 147 placed therebetween. In the present embodiment, conductive plate 148 is disposed on the side closer to contacted section 142 (in other words, the outside in the width direction) than detecting laminate 150 (specifically, detection pad 153) to be described later. Such conductive plate 148 is electrically connected to contacted section 142 via elastic member 144. Thus, when the object comes into contact with contacted section 142, a capacitance change occurs between conductive plate 148 and detection pad 153.

The size of conductive plate 148 is preferably similar to the size of the detection region of detection pad 153. This makes it possible to detect the contact between the object and contacted section 142 in a wide region of detection pad 153 and enhance the sensitivity to detect the contact of the object. For example, the ratio of the size of the surface of conductive plate 148, which corresponds to the detection region, to the size of the surface of the detection region, is preferably from 0.8 to 1.2.

First ground portion 149 is disposed in a plane including conductive plate 148 so as to surround conductive plate 148. First ground portion 149 is electrically connected to second ground portion 152 (described later). First ground portion 149 can release static electricity, generated in conductive plate 148 by application from contacted section 142. It is thereby possible to prevent destruction, malfunction, and the like of equipment caused by the static electricity.

Detecting laminate 150 will be described here. As illustrated in FIG. 8B, detecting laminate 150 has substrate 151, second ground portion 152, detection pad 153, and third ground section 154 in order from the inside in the width direction (the lower side in FIG. 8B). Insulating layer 147 insulates detecting laminate 150 from conductive plate 148. Therefore, malfunction due to electric disturbance can be prevented in detecting laminate 150.

Substrate 151 is a member for supporting each component of detecting laminate 150. Substrate 151 is, for example, a printed circuit board on which control section 160 is mounted. Control section 160 is connected to detection pad 153 so as to receive results of detection of a capacitance change in detection pad 153. In the present embodiment, in detection section 145, substrate 151 is disposed inside in the width direction from conductive plate 148, insulating layer 147, and detection pad 153. In other words, conductive plate 148, insulating layer 147, and detection pad 153 are disposed between substrate 151 and contacted section 142.

Second ground portion 152 is disposed between substrate 151 and detection pad 153. Second ground portion 152 protects detection pad 153 from noise. This can prevent an unexpected capacitance change. From the viewpoint of reducing a parasitic capacitance between detection pad 153 and second ground portion 152, second ground portion 152 preferably has the shape of mesh.

Detection pad 153 is a capacitive detection pad that detects a capacitance change caused by the contact between the object and contacted section 142. As detection pad 153, a known detection pad usable as a touch sensor can be used.

Third ground section 154 is disposed in a plane including detection pad 153 so as to surround detection pad 153. Third ground section 154 is electrically connected to second ground portion 152. Third ground section 154 protects detection pad 153 from noise. This can prevent an unexpected capacitance change.

Front-end cover 146 is disposed so as to cover second opening 1413 of temple 140 at the front end of temple 140. At this time, front-end cover 146 abuts on one end (front end) of spacer 143 and one end (front end) of detection section 145 in the longitudinal direction of casing 141 (see FIGS. 4 and 6C). This makes it possible to fix the positions of spacer 143 and detection section 145. Note that front-end cover 146 may only be disposed so as to abut on one end (front end) of spacer 143 and one end (front end) of detection section 145, and to cover second opening 1413 of temple 140, and does not need to close all second opening 1413.

4) Control Section

Control section 160 is electrically connected to detection pad 153 of detection section 145 and the electrode (each of first electrode 112 and second electrode 114) of lens 110. When detection section 145 detects the contact between the object and contacted section 142, control section 160 applies the voltage to each of the pair of lenses 110 or stops applying the voltage to each of the pair of lenses 110, to vary the focal length (power) of first region 1101) (see FIG. 2). Control section 160 has a control circuit that controls, for example, driving of detection pad 153, detection of a capacitance change in detection pad 153, and application of the voltage to first region 1101 of lens 110. Control section 160 is mounted on substrate 151 of detection section 145, for example.

5) Power Source

Power source 170 supplies electric power to detection section 145 and control section 160 (see FIG. 2). In the present embodiment, power source 170 is a rechargeable battery pack removably held in the other end (the third opening provided at the rear end) of temple 140. Examples of power source 170 include a nickel-metal hydride battery.

(Operation of Electronic Glasses)

Subsequently, an example of the operation of electronic glasses 100 will be described. First, a state (off-state) where no voltage is being applied to liquid crystal layer 113 of electronic glasses 100 will be described. In the off-state, in first region 1101 of lens 110, the refractive index of liquid crystal layer 113 and the refractive index of each of first substrate 111 and second substrate 115 are almost the same. There thus occurs no lens effect attributable to liquid crystal layer 113. Therefore, in lens 110, the focal length (power) of first region 1101 and the focal length (power) of second region 1102 are almost the same as each other.

When the object being the conductor (for example, the finger of the user) comes into contact with contacted section 142, detection pad 153 of detection section 145 detects a capacitance change based on the contact. The detection result of the contact is transmitted to control section 160. When sensing the contact with contacted section 142 in the off-state, control section 160 applies the voltage to first region 1101 of lens 110. Thereby, the orientation of the liquid crystal material in liquid crystal layer 113 changes, and the refractive index of liquid crystal layer 113 changes (on-state). In the on-state, the refractive index of liquid crystal layer 113 and the refractive index of each of first substrate 111 and second substrate 115 are different from each other. Hence the lens effect attributable to liquid crystal layer 113 occurs in first region 1101. Therefore, the focal length (power) of first region 1101 can be changed.

In the on-state, when the object comes into contact with contacted section 142, the detection result of the contact is transmitted to control section 160 in the same manner as above. When sensing the contact with contacted section 142 in the on-state, control section 160 stops applying the voltage to first region 1101 of lens 110. Thereby, the orientation of the liquid crystal material in liquid crystal layer 113 returns to the state before the application of the voltage, and the refractive index of liquid crystal layer 113 also returns to the state before the application of the voltage (off-state).

As described above, in electronic glasses 100 according to the present embodiment, it is possible to vary the focal length of first region 1101 in lens 110 by the contact of the object with contacted section 142.

(Effects)

Electronic glasses 100 according to the present embodiment has contacted section 142 having conductivity and detection section 145. Contacted section 142 is connected to detection section 145 (conductive plate 148 in the present embodiment) so that a capacitance change that occurs due to the contact with the object occurs in detection pad 153. As compared with a conventional touch sensor pad having the detection region of detection pad covered with the cover member, in electronic glasses 100 according to the present embodiment, at least a part of contacted section 142 is disposed so as to be exposed to the outside of casing 141. Hence a capacitance change in detection pad 153 is large when the object comes into contact with contacted section 142, whereby the contact of the object can be detected with high sensitivity.

Embodiment 2

In electronic glasses and a frame according to Embodiment 2, only a configuration of temple 240 is different from that of temple 140 according to Embodiment 1. Therefore, only temple 240 will be described and the description of the same components as the components of the electronic glasses and the frame according to Embodiment 1 will be omitted while the same numerals as in Embodiment 1 will be provided.

Figure 9:
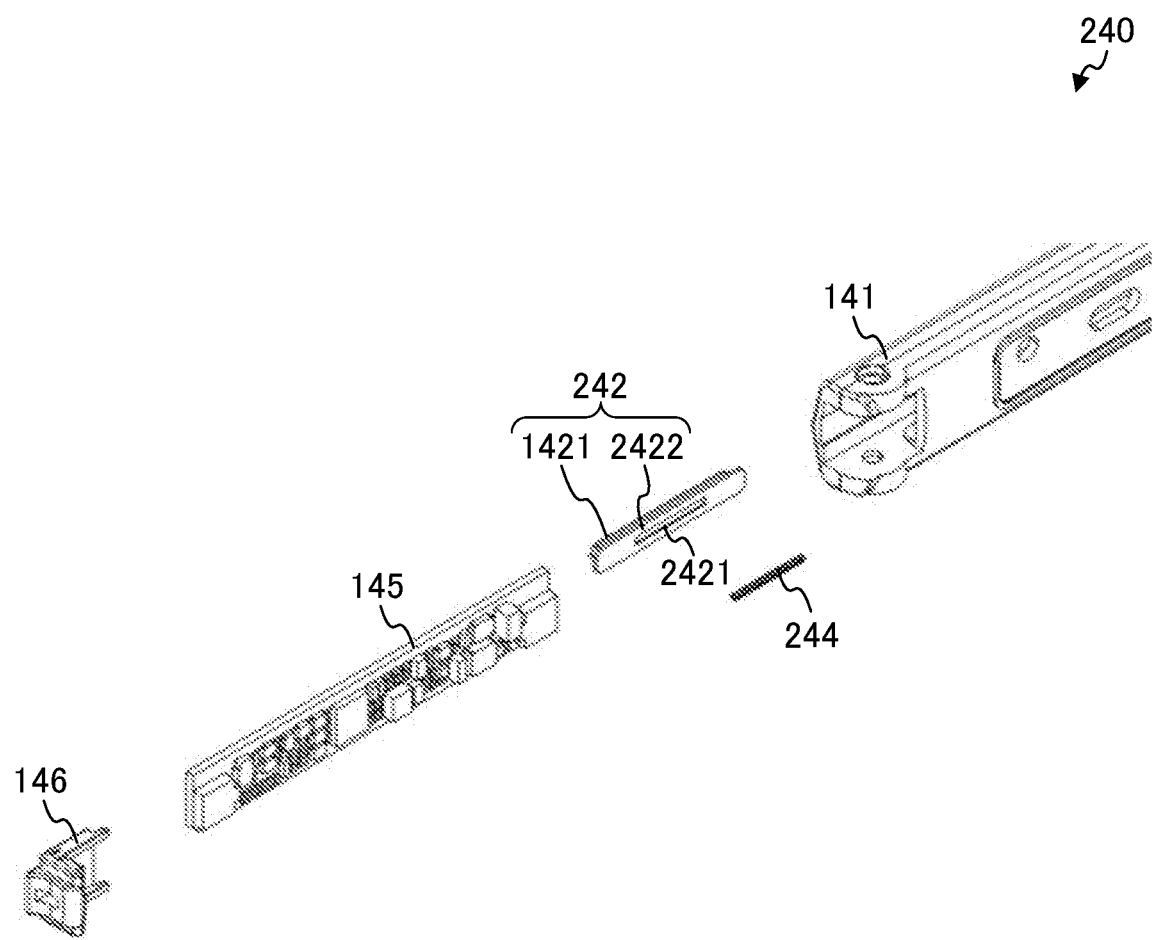
FIG. 9 is an exploded view illustrating an example of a configuration of a temple according to Embodiment 2.
Figure 10A:
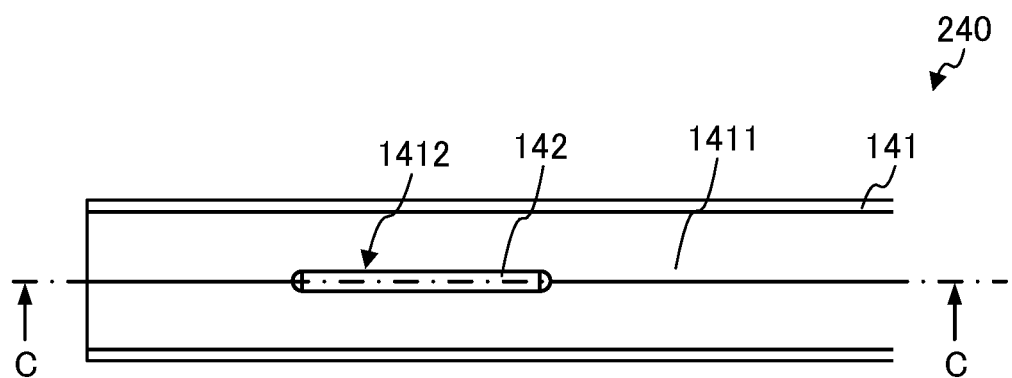
FIGS. 10A to 10C are partial enlarged view illustrating an example of the configuration of the front end of the temple according to Embodiment 2.
Figure 10B:
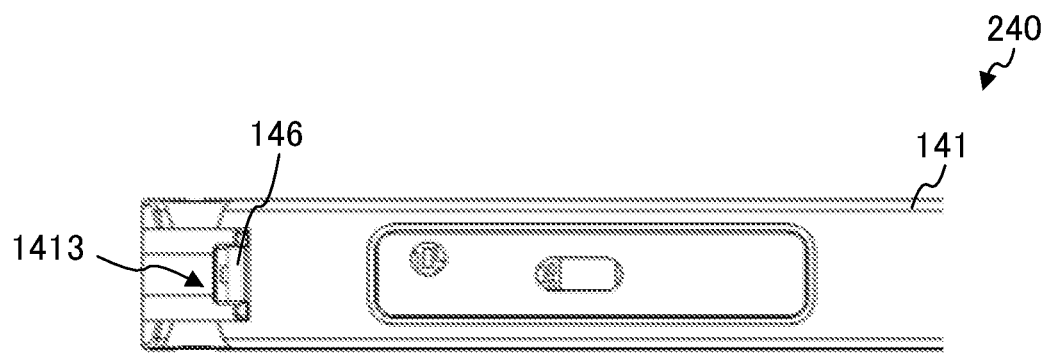
Figure 10C:
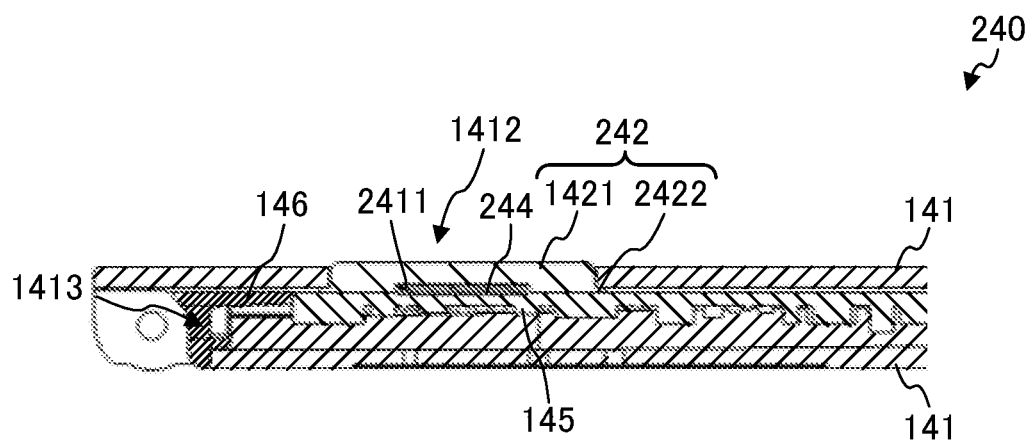

FIG. 9 is an exploded view illustrating an example of the configuration of temple 240. FIG. 9 is a partial enlarged view illustrating the front end of temple 240 as seen from the inside of the electronic glasses according to Embodiment 2. FIGS. 10A to 10C are partial enlarged views illustrating an example of the configuration of the front end of temple 240. FIG. 10A is a left-side view (the outer-side view in the width direction) of the front end of temple 240, FIG. 10B is a right-side view (the inner-side view in the width direction) of the front of temple 240, and FIG. 10C is a sectional view cut along a line C-C in FIG. 10A.

Note that the pair of temples 240 are formed so as to be almost symmetrical in the electronic glasses and have components being the same as each other. Therefore, in the following, temple 240 for the right side will be described, and the description of the components of temple 240 for the left side will be omitted.

As illustrated in FIGS. 9 and 10A to 10C, temple 240 has casing 141, contacted section 242, elastic member 244, detection section 145, and front-end cover 146. Temple 240 is connected to front 130 at the front end thereof. For example, temple 240 is rotatably engaged with rim 131 of front 130.

Contacted section 242 is a portion with which the object such as the finger of the user of electronic glasses can come into contact. Hence at least a part of contacted section 242 is disposed so as to be exposed to the outside of casing 141. In the present embodiment, contacted section 242 is disposed such that a part of contacted section 242 is exposed from first opening 1412 to the outside (in other words, the outside in the width direction) of casing 141.

In the present embodiment, contacted section 242 has exposed portion 1421 and stored portion 2422 stored inside casing 141. For example, stored portion 2422 has the shape of a plate. In the present embodiment, recess 2421 is formed on the surface of contacted section 242, the surface being located inside casing 141 (the front surface of stored portion 2422). Note that contacted section 242 is similar to contacted section 142 in Embodiment 1 except that recess 2421 is formed on the front surface of stored portion 2422.

At least a part of elastic member 244 is disposed in recess 2421. The shape and size of recess 2421 are not particularly limited so long as an appropriate space corresponding to the size of elastic member 244 can be formed. In the present embodiment, recess 2421 is a recess having a rectangular columnar shape and formed at the center of stored portion 2422 in contacted section 242.

Elastic member 244 has elasticity and conductivity. Elastic member 244 is disposed between contacted section 242 and detection section 145 so as to electrically connect between contacted section 242 and detection section 145 and urge contacted section 242 to the outside of casing 141 (specifically, the outside in the width direction). Thereby, elastic member 244 can electrically connect between contacted section 242 and detection section 145 appropriately while preventing positional displacement of contacted section 242. In the present embodiment, elastic member 244 is disposed so as to abut on the center of contacted section 242 in recess 2421 of contacted section 242. More specifically, a part of elastic member 244 is disposed in recess 2421.

Elastic member 244 may only be able to exert the above function. In the present embodiment, elastic member 244 is a coil spring. Elastic member 244 may be disposed such that the axial direction of the coil spring extends along the front surface of stored portion 2422, or may be disposed such that the axial direction of the coil spring is orthogonal to the front surface of stored portion 2422. From the viewpoint of increasing the contact area between contacted section 242 and elastic member 244 and the contact area between elastic member 244 and detection section 145, elastic member 244 is preferably disposed such that the axial direction of the coil spring extends along the front surface of stored portion 2422. Elastic member 244 has conductivity from the viewpoint of electrically connecting between contacted section 242 and detection section 145. Examples of a material for elastic member 244 are the same as those for elastic member 144 of Embodiment 1.

(Effects)

The electronic glasses, the frame, and temple 240 according to Embodiment 2 also have similar effects to those of Embodiment 1. In temple 240 according to Embodiment 2, recess 2421 is formed on the surface of contacted section 242, the surface being located inside casing 141 (the front surface of stored portion 2422), and at least a part of elastic member 244 is disposed in recess 2421, whereby a spacer (see Embodiment 1) does not need to be provided between contacted section 242 and detection section 145. As thus described, in Embodiment 2, the number of parts of temple 240 can be reduced.

Embodiment 3

In electronic glasses and a frame according to Embodiment 3, only a configuration of temple 340 is different from that of temple 140 according to Embodiment 1. Therefore, only temple 340 will be described and the description of the same components as the components of the electronic glasses and the frame according to Embodiment 1 will be omitted while the same numerals as in Embodiment 1 will be provided.

Figure 11:
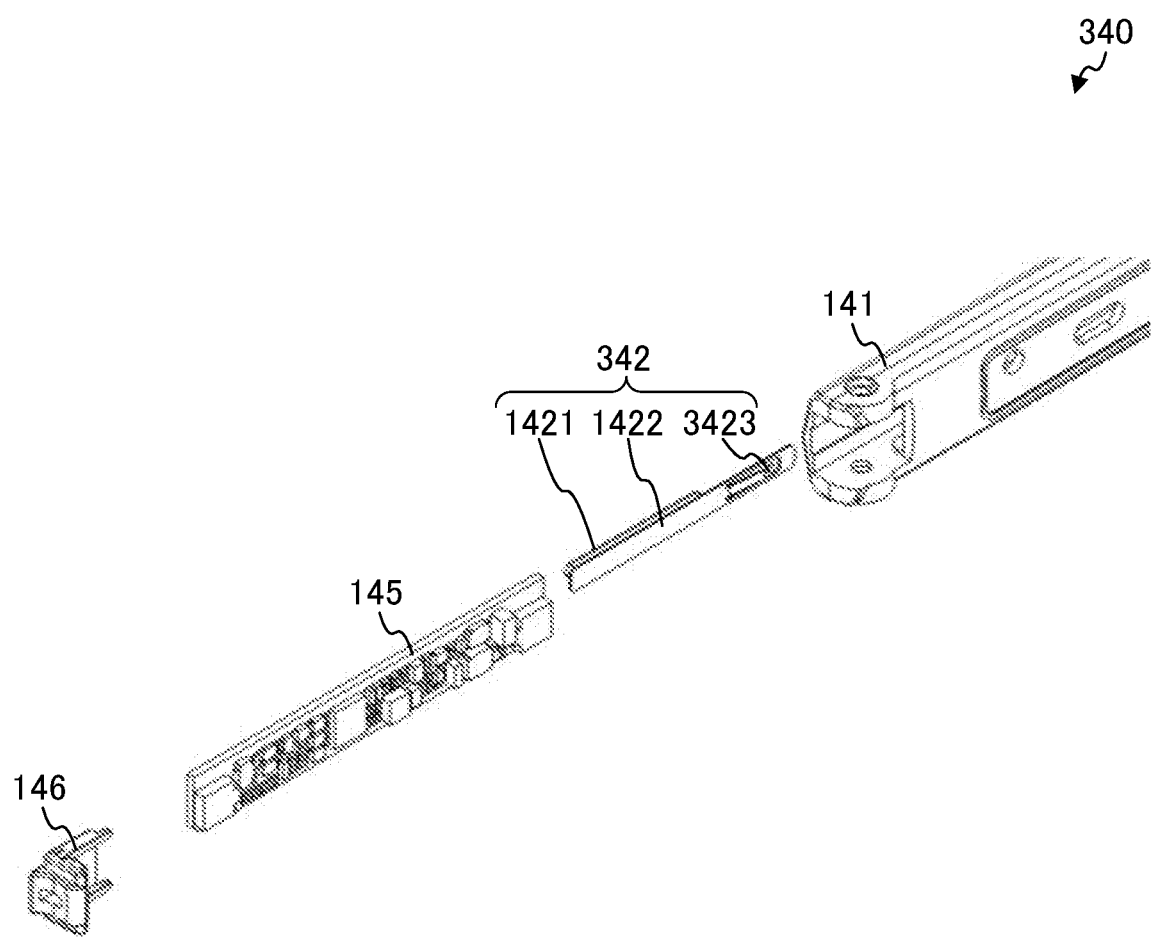
FIG. 11 is an exploded view illustrating an example of a configuration of a temple according to Embodiment 3.
Figure 12A:
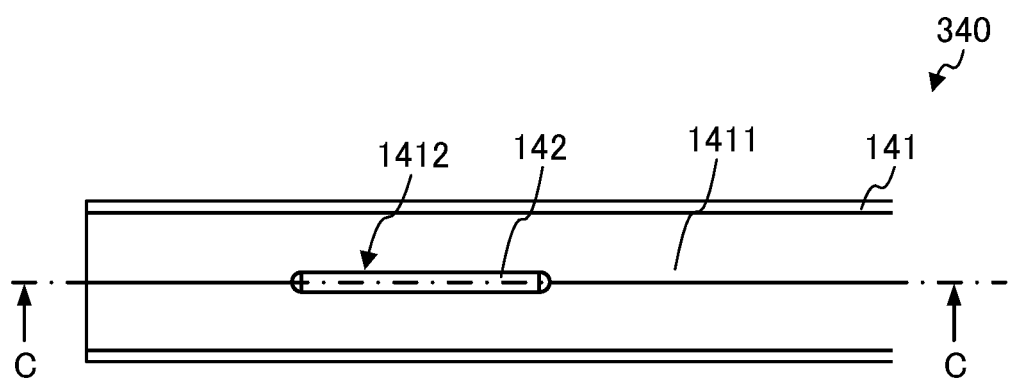
FIGS. 12A to 12C are partial enlarged views illustrating an example of the configuration of the front end of the temple according to Embodiment 3.
Figure 12B:
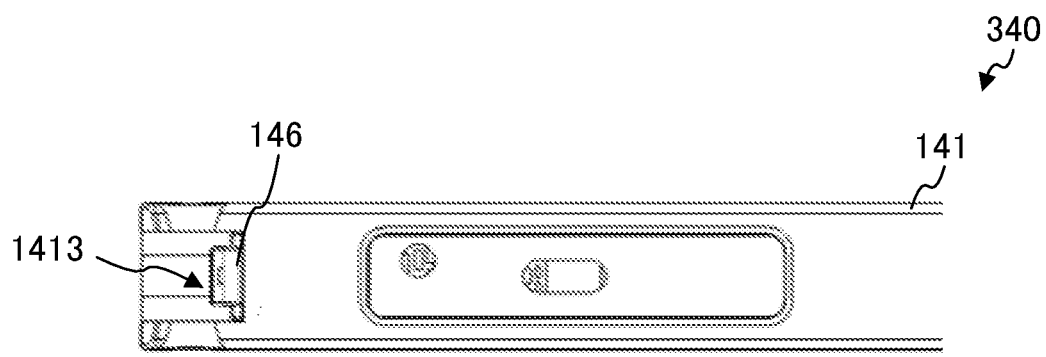
Figure 12C:
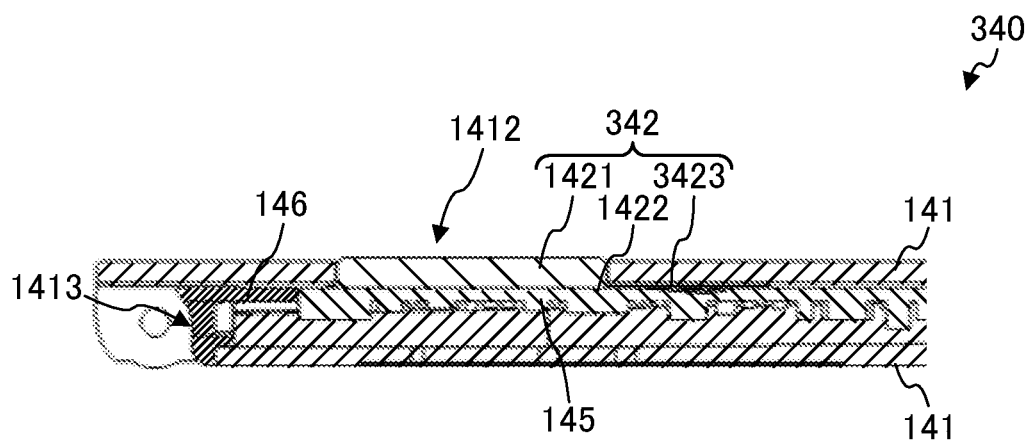

FIG. 11 is an exploded view illustrating an example of the configuration of temple 340. FIG. 11 is a partial enlarged view illustrating the front end of temple 340 as seen from the inside of the electronic glasses according to Embodiment 3. FIGS. 12A to 12C are partial enlarged views illustrating an example of the configuration of the front end of temple 340. FIG. 12A is a left-side view (the outer-side view in the width direction) of the front end of temple 340, FIG. 12B is a right-side view (the inner-side view in the width direction) of the front end of temple 340, and FIG. 12C is a sectional view cut along a line C-C in FIG. 12A.

Note that the pair of temples 340 are formed so as to be almost symmetrical in the electronic glasses and have components being the same as each other. Therefore, in the following, temple 340 for right side will be described, and the description of the components of temple 340 for left side will be omitted.

As illustrated in FIGS. 11 and 12A to 12C, temple 340 has casing 141, contacted section 342, detection section 145, and front-end cover 146. Temple 340 is connected to front 130 at the front end thereof. For example, temple 340 is rotatably engaged with rim 131 of front 130.

Contacted section 342 is a portion with which the object such as the finger of the user of electronic glasses can come into contact. Hence at least a part of contacted section 342 is disposed so as to be exposed to the outside of casing 141. In the present embodiment, contacted section 342 is disposed such that a part of contacted section 342 is exposed from first opening 1412 to the outside (in other words, the outside in the width direction) of casing 141.

Contacted section 342 has exposed portion 1421, stored portion 1422, and a fixed portion (holding section) 3423 fixed to a part of stored portion 1422. Fixed portion 3423 is electrically connected to contacted section 342 and detection section 145 by abutting on detection section 145 (specifically, conductive plate 148). Further, based on the elastic force of its own, fixed portion 3423 urges exposed portion 1421 and stored portion 1422 of contacted section 342 to the outside (specifically, the outside in the width direction) of casing 141. That is, fixed portion 3423 has a similar function to those of elastic members 144, 244 of Embodiments 1 and 2 described above. Note that contacted section 342 is similar to contacted section 142 in Embodiment 1 except for having fixed portion 3423.

In the present embodiment, in an assembled state (the state illustrated in FIGS. 12A to 12C), fixed portion 3423 has elasticity in the outward direction (specifically, the outside in the width direction) of casing 141 and functions as the holding section for holding the position of contacted section 342. The shape and size of fixed portion 3423 are not particularly limited so long as the above function can be obtained. In the present embodiment, fixed portion 3424 has a flat-spring structure.

Specifically, the base end of fixed portion 3423 is fixed to the inner surface of stored portion 1422 in the width direction. Meanwhile, the tip of fixed portion 3423 is a free end not fixed to the other portion. Fixed portion 3423 as thus described is inclined such that the tip end is located on the inside in the width direction from the base end in a free state (the state illustrated in FIG. 11). While being in contact with conductive plate 148 of detection section 145, fixed portion 3424 can hold a position of contacted section 342 (exposed portion 1421) by the elastic force of the flat-spring structure. Relative positional displacement between contacted section 342 and conductive plate 148 is allowable by fixed portion 3423 of contacted section 342 having the flat-spring structure. This ensures the contact between contacted section 342 and conductive plate 148.

Contacted section 342 moves to the inside (specifically, the inside in the width direction) of casing 141 when pressed by the object. Before and after contacted section 342 moves to the inside of casing 141, fixed portion 3423 is constantly in contact with conductive plate 148 of detection section 145 due to the elastic force of flat-spring structure of fixed portion 3423. Hence the contact of the object being the conductor with contacted section 342 is electrically transmitted to detection section 145. Contacted section 342 has conductivity from the viewpoint of electrically connecting between contacted section 342 and detection section 145. Examples of a material for contacted section 342 are the same as those for contacted section 142 of Embodiment 1.

(Effects)

The electronic glasses, the frame, and temple 340 according to Embodiment 3 also have similar effects to those of Embodiment 1. In Embodiment 3, contacted section 342 itself has elasticity. That is, contacted section 342 has fixed portion 3423 with a similar function to those of elastic members 144, 244 of Embodiments 1 and 2 described above. For this reason, temple 340 does not need to have an elastic member (see Embodiments 1 and 2) between contacted section 342 and detection section 145. As thus described, in Embodiment 3, the number of parts of temple 340 can be reduced.

Embodiment 4

In electronic glasses and a frame according to Embodiment 4, only a configuration of temple 440 is different from that of temple 140 according to Embodiment 1. Therefore, only temple 440 will be described and the description of the same components as the components of the electronic glasses and the frame according to Embodiment 1 will be omitted while the same numerals as in Embodiment 1 will be provided.

Figure 13:
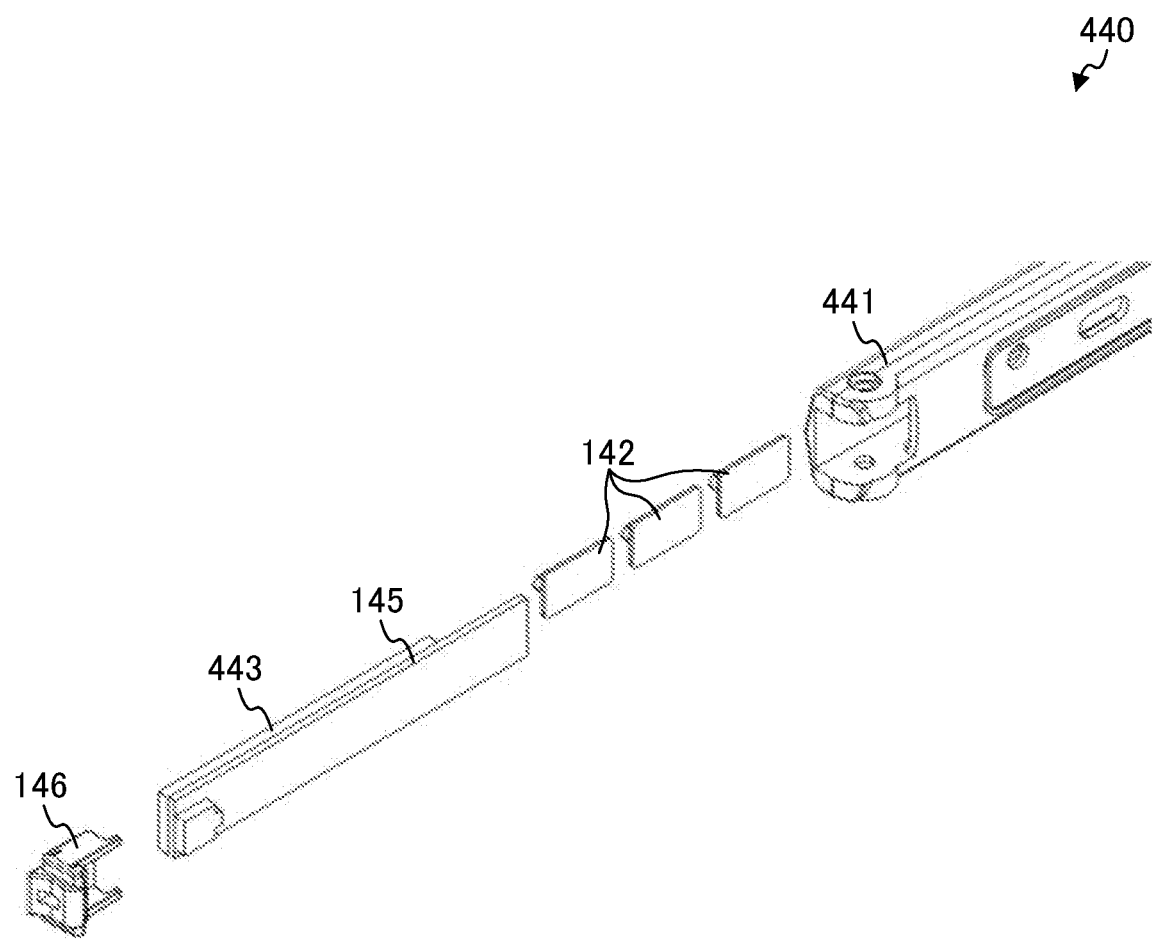
FIG. 13 is an exploded view illustrating an example of a configuration of a temple according to Embodiment 4.
Figure 14A:
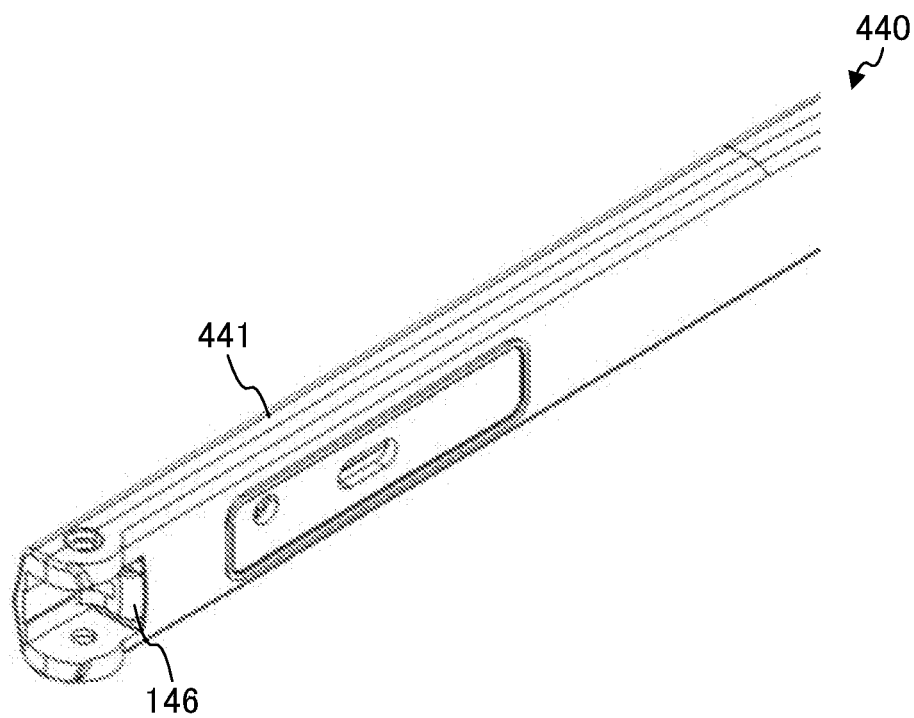
FIGS. 14A and 14B are partially enlarged perspective views illustrating an example of the configuration of the front end of the temple according to Embodiment 4.
Figure 14B:
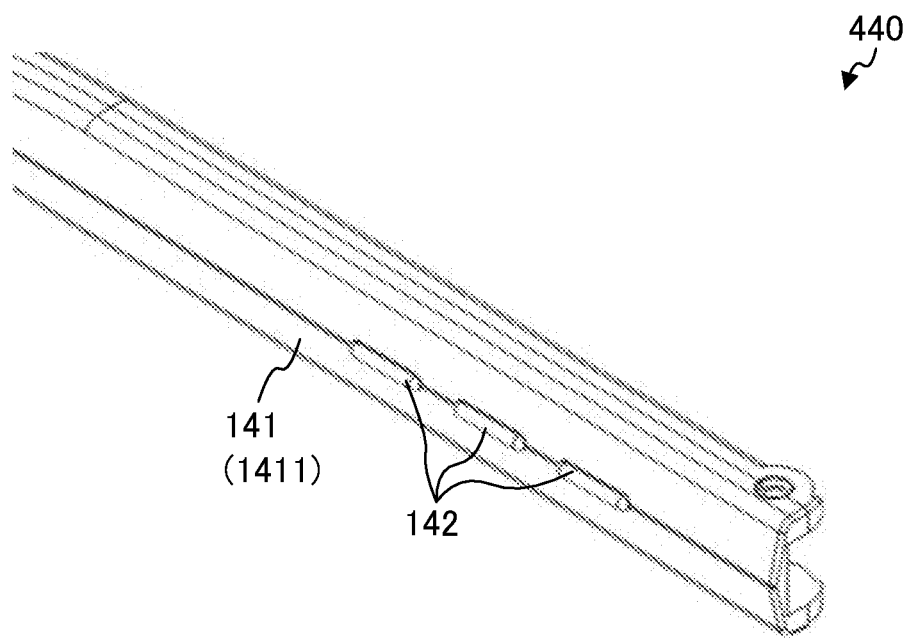
Figure 15A:
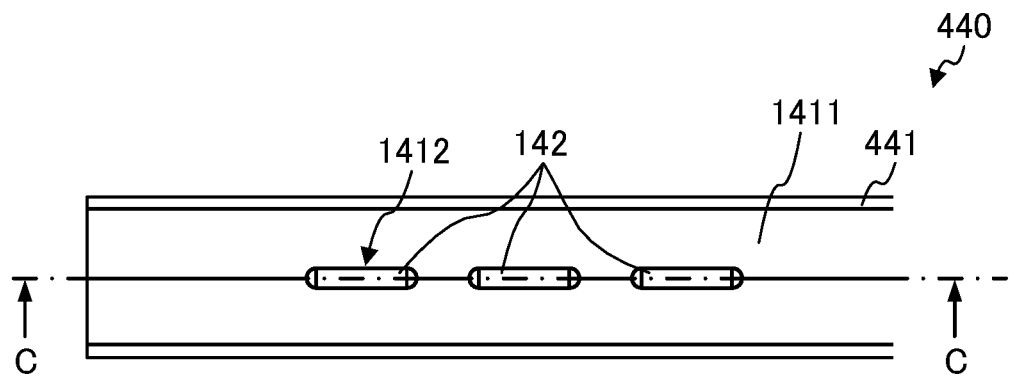
FIGS. 15A to 15C are a partial enlarged view illustrating an example of the configuration of the front end of the temple according to Embodiment 4.
Figure 15B:
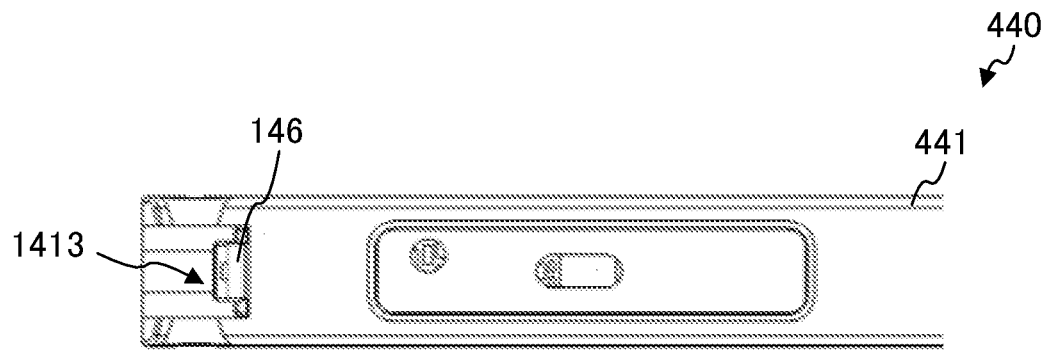
Figure 15C:
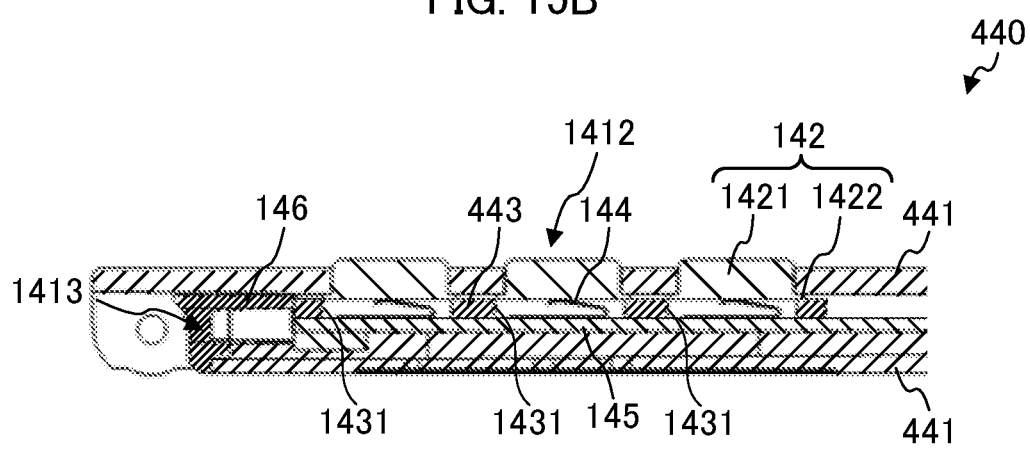

FIG. 13 is an exploded view illustrating an example of the configuration of temple 440. FIG. 13 is a partial enlarged view of a state in which the front end of the electronic glasses according to Embodiment 4 is seen from the inside in the width direction (a direction of arrow α in FIG. 1). FIGS. 14A and 14B are partially enlarged perspective views illustrating an example of the configuration of the front end of temple 440. FIG. 14A is a partially enlarged perspective view illustrating an example of the configuration of the front end of temple 440 as seen from the inside in the width direction of the electronic glasses (the direction of arrow α in FIG. 1), and FIG. 14B is a partially enlarged perspective view illustrating an example of the configuration of the front end of temple 440 as seen from the outside in the width direction of the electronic glasses (a direction of arrow β in FIG. 1). FIGS. 15A to 15C are partial enlarged views illustrating an example of the configuration of the front end of temple 440. FIG. 15A is a left-side view (outer-side view) of the front end of temple 440, FIG. 15B is a right-side view (inner-side view) of the front of temple 440, and FIG. 15C is a sectional view cut along a line C-C in FIG. 15A.

Note that the pair of temples 440 are formed so as to be almost symmetrical in the electronic glasses and have components being the same as each other. Therefore, in the following, temple 440 for the right side will be described, and the description of the components of temple 440 for the left side will be omitted.

As illustrated in FIGS. 13, 14A, 14B, and 15A to 15C, temple 440 has casing 441, three contacted sections 142, spacer 443, three elastic members 144, detection section 145, and front-end cover 146. Temple 440 is connected to front 130 at the front end thereof. For example, temple 440 is rotatably engaged with rim 131 of front 130.

Casing 441 constitutes the outer shape of temple 440. Casing 441 stores a part of each of three contacted sections 142, spacer 443, three elastic members 144, and detection section 145. Three first openings 1412 each having an elongated shape along the longitudinal direction of casing 441 is formed on the left-side surface (outer surface) of the front end of casing 441 (see FIGS. 15A and 15C). Note that casing 441 is similar to casing 141 in Embodiment 1 except that the number of first openings 1412 is three.

In Embodiment 4, three contacted sections 142 are disposed such that a part of each contacted section 142 is exposed from each of three first openings 1412 to the outside (specifically, the outside in the width direction) of casing 441. The interval between adjacent contacted sections 142 (in other words, first openings 1412) are not particularly limited, but can be adjusted as appropriate according to the need.

The shapes and sizes of three contacted sections 142 may be the same as or different from each other. In the present embodiment, the shapes and sizes of three contacted sections 142 are the same as each other.

Spacer 443 is disposed between three contacted sections 142 and detection section 145. Spacer 443 has insulating properties. The shape and size of spacer 443 are not particularly limited so long as an appropriate space corresponding to the size of elastic member 144 can be formed. In the present embodiment, spacer 443 is a plate-like member with three through holes 1431 each having a rectangular columnar shape formed therein.

Three elastic members 144 have elasticity and conductivity. Three elastic members 144 are disposed so as to abut on three contacted sections 142 and detection section 145 (specifically, three conductive plates 148 to be described later), respectively, in through hole 1431 of spacer 443. Three elastic members 144 may be the same as or different from each other. In the present embodiment, three elastic members 144 are the same as each other.

In the present embodiment, each of three contacted sections 142 is connected to detection section 145 via elastic member 144 so that a capacitance change caused by the contact between the object and contacted section 142 occurs in detection pad 153. That is, three contacted sections 142 are each connected to one detection section 145 in an electrically independent manner. In the present embodiment, the number of conductive plates 148 is three. More specifically, three conductive plates 148 are disposed so as to face different regions in the detection region of detection pad 153. Detection pad 153 has a position awareness function and can thus distinguish and become aware of contacted section 142 to which the object has contacted based on the position where the capacitance change occurs in detection pad 153.

(Effects)

The electronic glasses, the frame, and temple 440 according to Embodiment 4 also have similar effects to those of Embodiment 1. In Embodiment 4, temple 440 has three contacted sections 142 and three elastic members 144. Therefore, in the present embodiment, the flexibility in design of the electronic glasses can be enhanced. For example, three contacted sections 142 can be used as switches configured to switch various functions in the electronic glasses in a mutually independent manner.

In Embodiment 4 above, temple 440 having three contacted sections 142, three elastic members 144, and one detection section 145 has been described, but the numbers of the respective components are not particularly limited, but can be adjusted as appropriate according to the need. For example, the number of detection sections (the number of elastic members) may be the same as the number of contacted sections.

Embodiment 5

(Configuration of Electronic Glasses)

In electronic glasses and a frame according to Embodiment 5, only a configuration of temple 540 is different from that of temple 140 according to Embodiment 1. Therefore, only temple 540 will be described and the description of the same components as the components of the electronic glasses and the frame according to Embodiment 1 will be omitted while the same numerals as in Embodiment 1 will be provided.

Embodiment 5 will be described below with reference to FIGS. 16 to 27. In the following description as well, when the "width direction", the "front-rear direction", and the "vertical direction" are mentioned without specific explanation, these mean the respective directions of electronic glasses 100 in an opened state (the state illustrated in FIG. 1) where the user can wear electronic glasses 100 as glasses.

In the following, the structure of one temple 540 of a pair of temples 540 (for example, temple 540 disposed on the right side of the user in the glasses wearing state) will be described. The structure of the other temple 540 (disposed on the left side of the user in the glasses wearing state) may have a structure almost symmetrical to one temple 540 or different from one temple 540.

Figure 16:
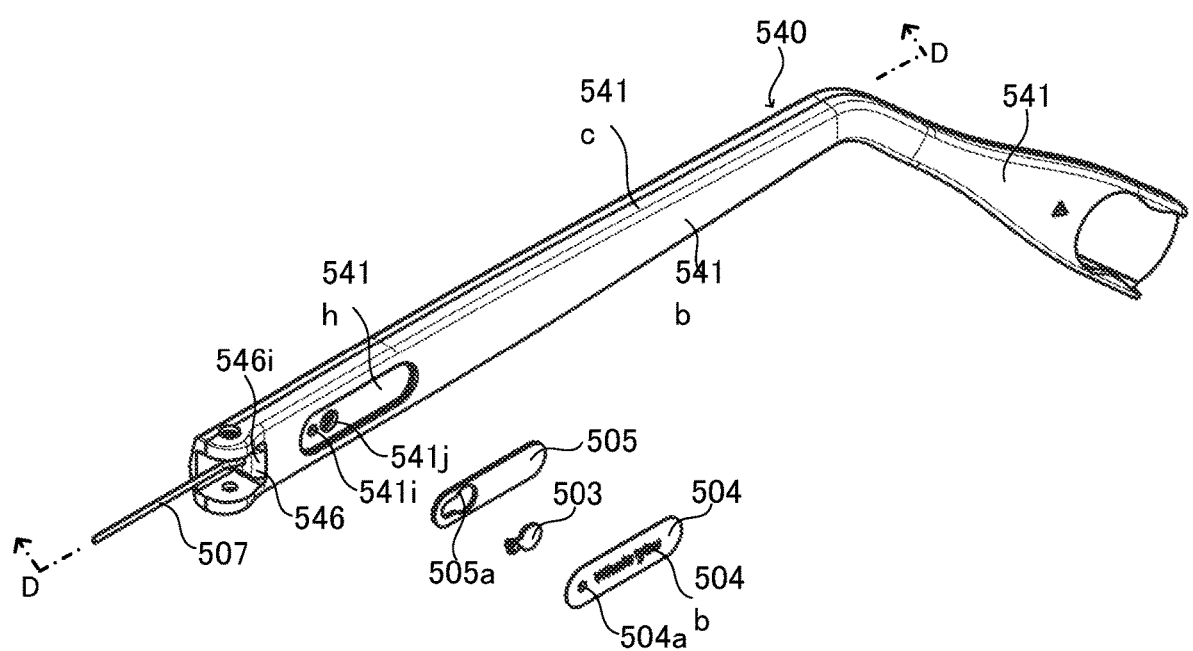
FIG. 16 is an exploded perspective view of a temple according to Embodiment 5, as seen from the inside in a width direction.
Figure 22:
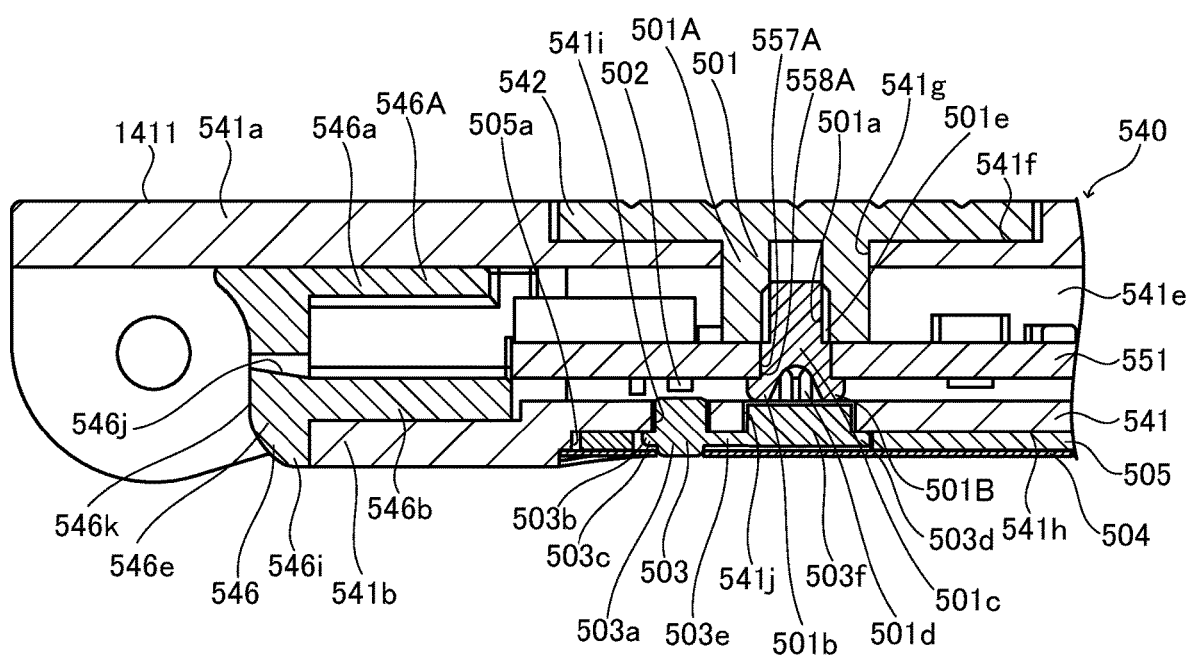
FIG. 22 is a sectional view of a portion corresponding to the portion X in FIG. 20.

As illustrated in FIGS. 16 and 22, temple 540 has casing 541, contacted section 542, detection section 545, light source 502, light guiding member 503, side cover 504, adhesive member 505, and front-end cover 546. Hereinafter, each member constituting temple 540 will be described.

1) Casing

Casing 541 constitutes the outer shape of temple 540 as illustrated in FIG. 16. Casing 541 has storage space 541e (see FIG. 22) that stores detection section 545. Casing 541 extends along one direction (specifically, the front-rear direction). Specifically, casing 541 has outer wall 541a provided outside in the width direction, and inner wall 541b disposed on the inside in the width direction (the lower side in FIG. 22) from outer wall 541a and facing outer wall 541a in the width direction.

Figure 17A:
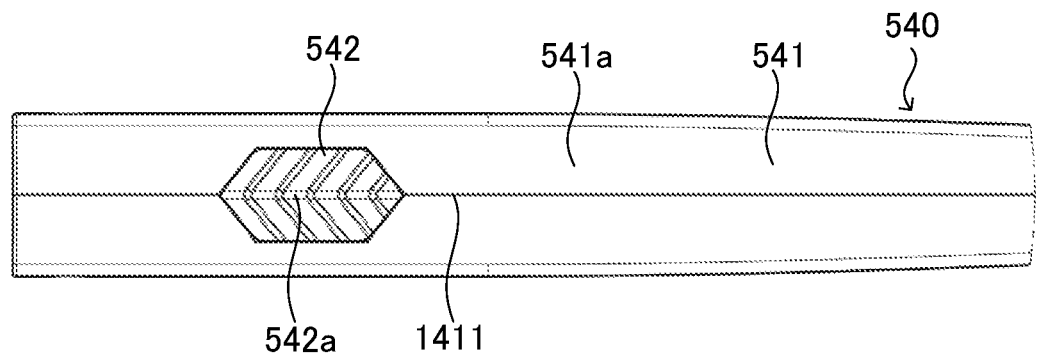
FIG. 17A is an outer-side view of the temple.
Figure 17B:
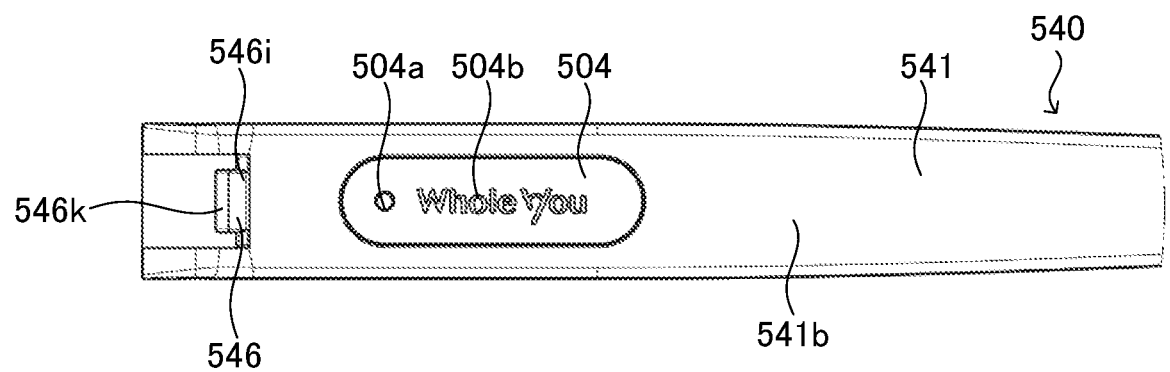
FIG. 17B is an inner-side view of the temple.

In the present embodiment, second protruding strip 1411 extending along the longitudinal direction of casing 541 is formed on the outer surface of outer wall 541a of casing 541 (see FIG. 17A). Further, a short-directional (also referred to as vertical) middle point of the outer surface of outer wall 541a is located on the ridge of second protruding strip 1411. The inner surface of inner wall 541b is a flat surface.

The upper end of outer wall 541a and the upper end of inner wall 541b are made continuous in the width direction by upper wall 541c. Meanwhile, the lower end of outer wall 541a and the lower end of inner wall 541b are made continuous in the width direction by lower wall 541d. A space surrounded by outer wall 541a, inner wall 541b, upper wall 541c, and lower wall 541d is storage space 541e of casing 541.

Outer wall 541a has outer recess 541f on the outer surface. Outer recess 541f has a substantially hexagonal shape as seen from the outside in the width direction. Outer recess 541f has outer through hole 541g at the bottom. Outer through hole 541g penetrates outer wall 541a from the bottom of outer recess 541f to the inner surface of outer wall 541a. Outer connection member 501A of connection member 501 to be described later is inserted into outer through hole 541g as thus described.

Inner wall 541b has inner recess 541h on the inner surface. Inner recess 541h has a long oval shape being long in the longitudinal direction (also referred to as the front-rear direction) of casing 541 as seen from the inside in the width direction. At least a part of such inner recess 541h overlaps in the width direction with outer recess 541f of outer wall 541a.

Inner recess 541h has first inner through hole 541i at the bottom. First inner through hole 541i penetrates inner wall 541b from the bottom of inner recess 541h to the outer surface (the top surface in FIG. 22) of inner wall 541b. A part of light guiding body 503a of light guiding member 503 to be described later is inserted into first inner through hole 541i as thus described.

Inner recess 541h has second inner through hole 541j in a position away from first inner through hole 541i. Second inner through hole 541j penetrates from the bottom of inner recess 541h to the outer surface (the top surface in FIG. 22) of inner wall 541b. At least a part of second inner through hole 541j overlaps in the width direction with outer through hole 541g of outer wall 541a. In the present embodiment, the central axis of second inner through hole 541j coincides with the central axis of outer through hole 541g.

Second inner through hole 541j has an inner diameter large enough to allow passage of inner connection member 501B of connection member 501 to be described later from the inside in the width direction to the outside in the width direction (from the lower side to the upper side in FIG. 22). Further, second inner through hole 541j has an inner diameter large enough to allow insertion of a tool (not illustrated) for engaging (screwing, in the present embodiment) inner connection member 501B with outer connection member 501A of connection member 501. In an assembled state, positioning protrusion 503f of light guiding member 503 to be described later is inserted from the inside in the width direction into second inner through hole 541j as thus described.

Figure 18A:
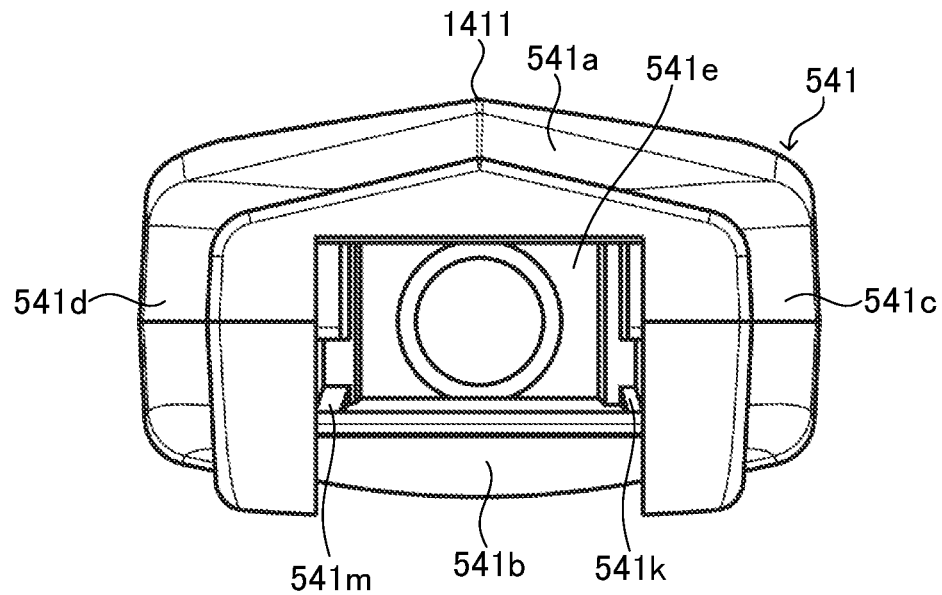
FIG. 18A is a front-end view of only the casing of the temple as seen from the front.
Figure 18B:
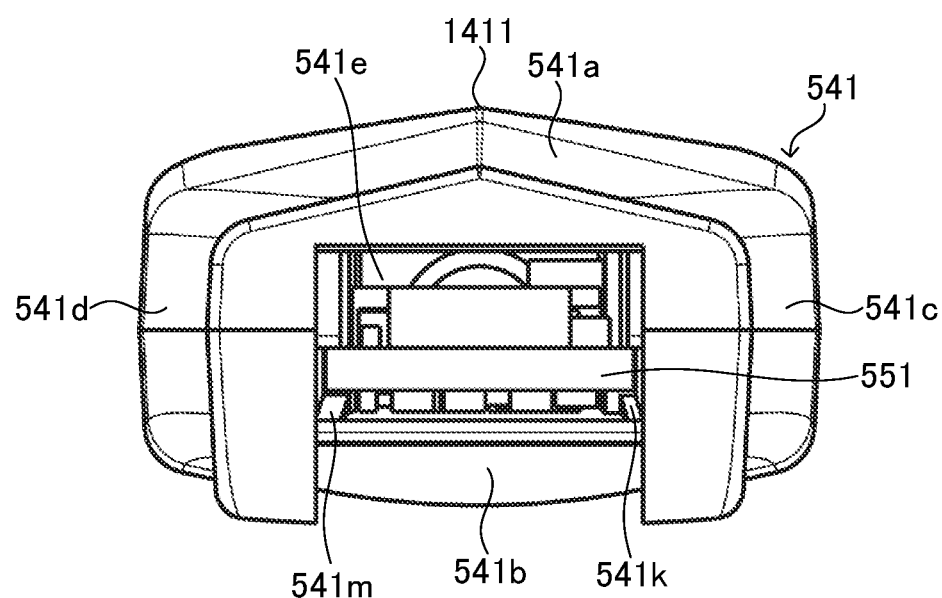
FIG. 18B is a front-end view of a state in which a substrate has been assembled to the casing of the temple, as seen from the front.
Figure 19:
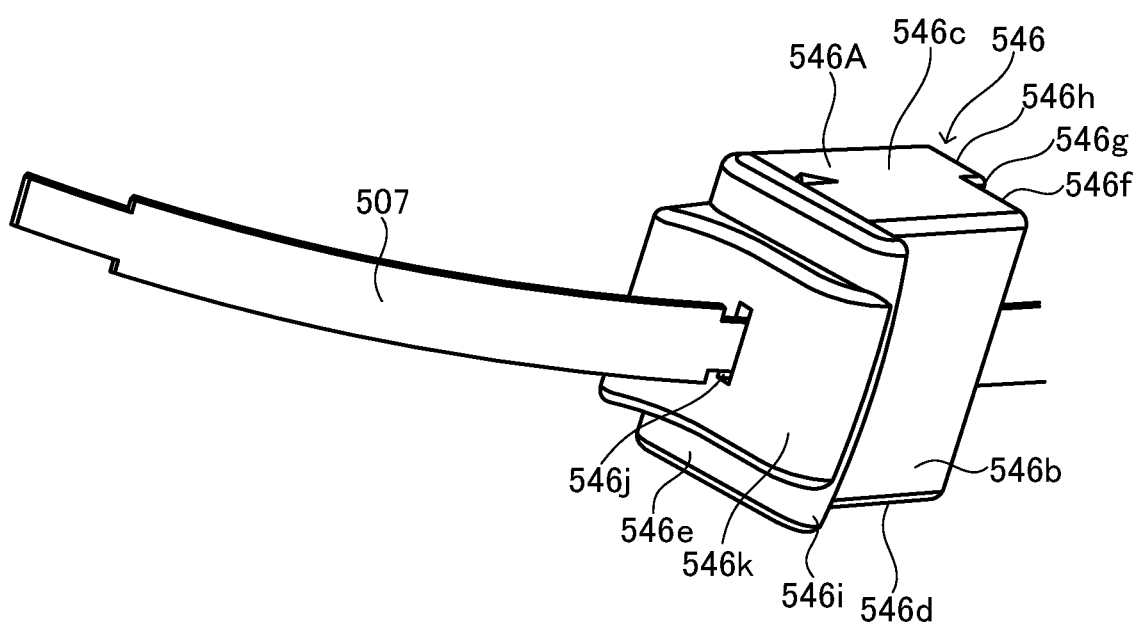
FIG. 19 is a perspective view of a front-end cover.
Figure 20:
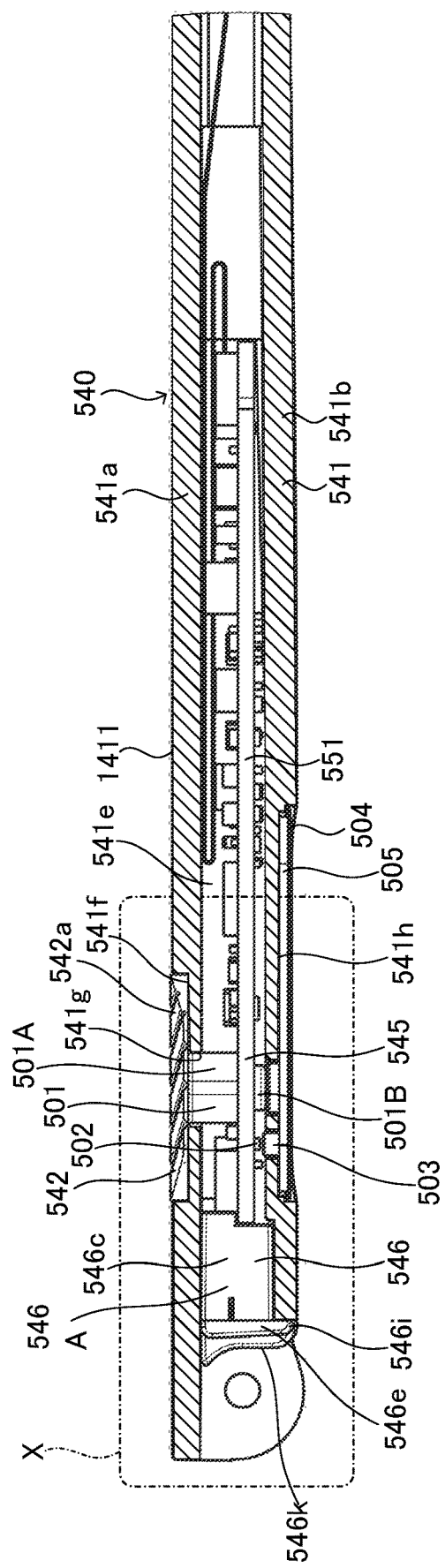
FIG. 20 is a partial sectional view illustrating a state in which in the temple illustrated in FIG. 16, only the casing has been cut along a line D-D.
Figure 26A:
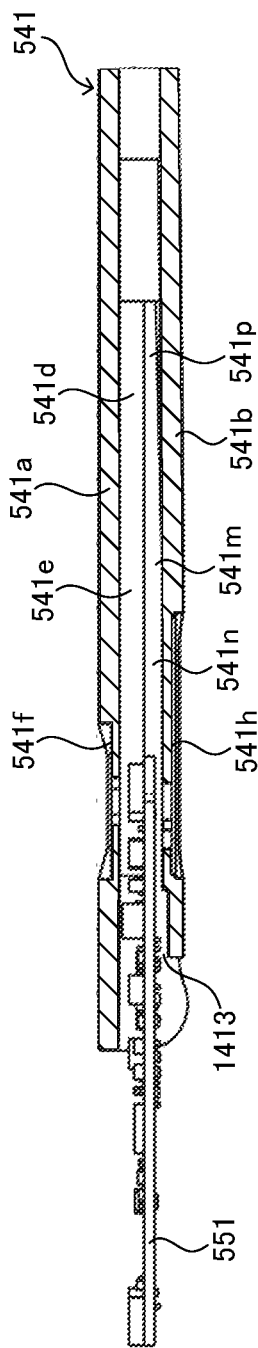
FIG. 26A is a view of the substrate being inserted into the casing.
Figure 26B:
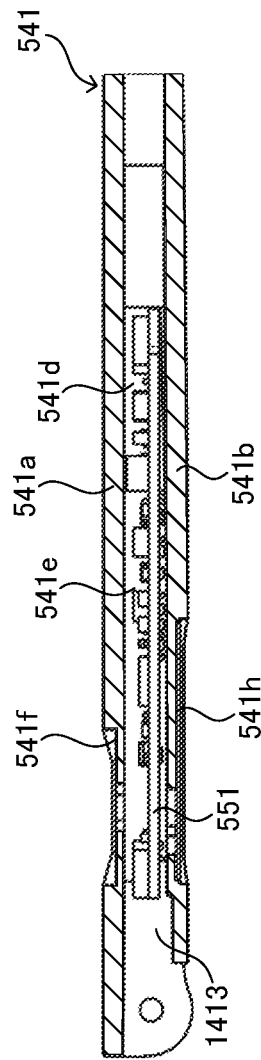
FIG. 26B illustrates a state in which the insertion of the substrate into the casing has been completed.
Figure 27A:
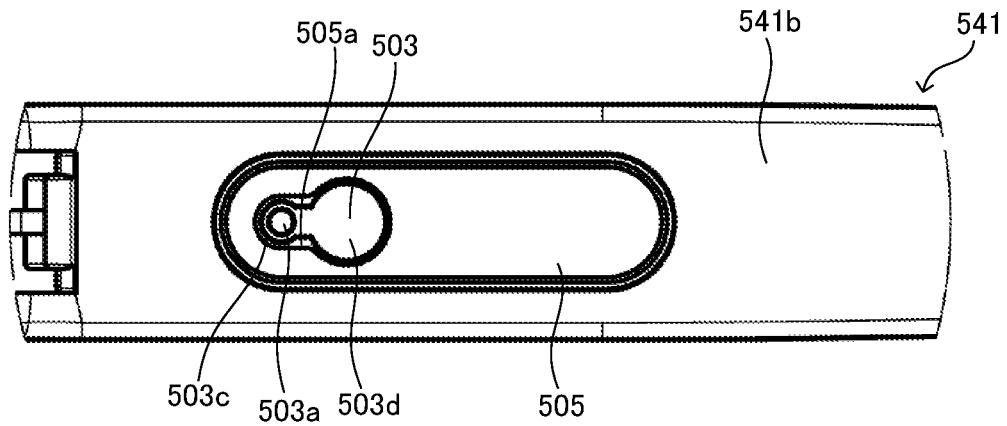
FIG. 27A is a partial plan view illustrating a state in which an adhesive member has been assembled to the casing.
Figure 27B:
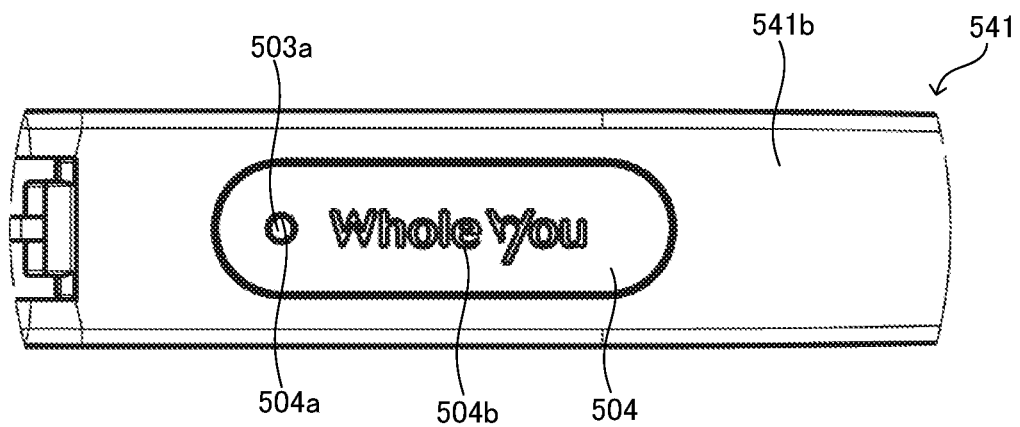
FIG. 27B is a partial plan view illustrating a state in which a side cover has been assembled to the casing.

Casing 541 has first guide groove 541k and second guide groove 541m on the inside surface (see FIGS. 18A, 18B, and 26A). First guide groove 541k and second guide groove 541m are guides at the time of disposing substrate 551 to be described later in storage space 541e of casing 541.

Specifically, casing 541 has first guide groove 541k on the inside surface (also referred to as the lower surface) of upper wall 541c and second guide groove 541m on the inside surface (also referred to as the upper surface) of lower wall 541d. Each of First guide groove 541k and second guide groove 541m extends in the front-rear direction and has the front end opened. The length of each of first guide groove 541k and second guide groove 541m in the front-rear direction is smaller than the length of substrate 551 to be described later in the width direction.

The width of the rear end of each of first guide groove 541k and second guide groove 541m is smaller than the width of front end. Specifically, first guide groove 541k and second guide groove 541m each have parallel groove 541n (see FIG. 26A) that has a constant width in the front-rear direction and inclined groove 541*p* (see FIG. 26A) provided in the rear of parallel groove 541*n*.

The width of inclined groove 541*p* becomes smaller toward the rear. First guide groove 541*k* and second guide groove 541*m* as thus described are engaged with the short-directional (also referred to as vertical) end of substrate 551 (also referred to as the vertical direction) to guide the displacement of substrate 551 in the longitudinal direction (also referred to as the front-rear direction).

2) Contacted Section

Contacted section 542 is a portion with which the object such as the finger of the user of electronic glasses 100 can come into contact. Hence at least a part of contacted section 542 is disposed so as to be exposed to the outside of casing 541.

Examples of a material for contacted section 542 include a metallic material having conductivity, such as gold, silver, copper, aluminum, iron, and an alloy of these. The contact of the object being a conductor with contacted section 542 is electrically transmitted to detection section 545 to be described later. Note that a path through which the contact is transmitted will be described later.

In the present embodiment, contacted section 542 is disposed in outer recess 541*f*. In this state, the outer surface of contacted section 542 is exposed to the outside of casing 541 in a state where the user's finger can come into contact with the outer surface.

Specifically, the shape of contacted section 542 as seen from the outside in the width direction is a substantially hexagonal shape slightly smaller than the outer-edge shape of outer recess 541*f* as seen from the same direction. At the short-directional center of casing 541 on the outer surface, contacted section 542 has contacted-section-side protruding strip 542*a* (see FIGS. 17A, 20, and 21) extending in the longitudinal direction of casing 541.

The outer surface of such contacted section 542 is on the same plane with a portion present on the periphery of outer recess 541*f* on the outer surface of casing 541. However, the outer surface of contacted section 542 may protrude outside in the width direction from the portion present on the periphery of outer recess 541*f* on the outer surface of casing 541 (specifically outer wall 541*a*). The inner surface of contacted section 542 abuts on the bottom of outer recess 541*f*.

The outer surface of contacted section 542 is more inclined toward the inside in the width direction (the lower side of each in FIGS. 18A and 18B) from contacted-section-side protruding strip 542*a* to each side of casing 541 in the short direction (the lateral direction in each of FIGS. 18A and 18B). Outer connection member 501A of connection member 501 to be described later is integrally provided with contacted section 542 on the inner surface of contacted section 542.

3) Detection Section

Figure 25:
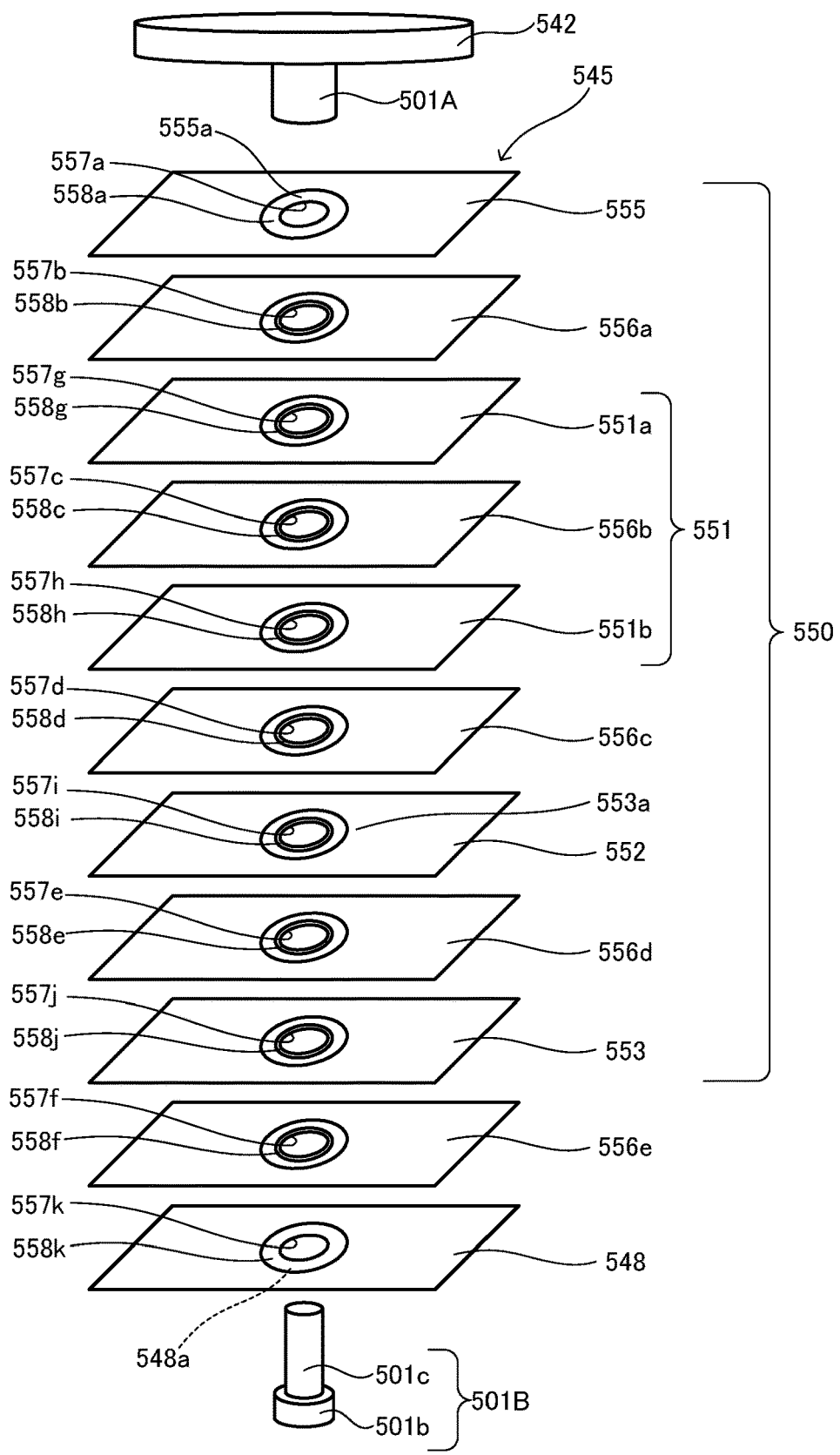
FIG. 25 is a schematic view illustrating a structure of the sensor module.

FIG. 25 is a schematic view for explaining the configuration of detection section 545. Detection section 545 is disposed in storage space 541*e* of casing 541 and electrically connected to contacted section 542. In detection section 545, a capacitance change occurs caused by contact between the object and contacted section 542.

Detection section 545 has through hole 557A (see FIG. 22) penetrating therethrough from the outer surface to the inner surface. Further, detection section 545 has, on the inner peripheral surface of through hole 557A, conduction section 558A (see FIG. 22) for electric conduction from the outer surface to the inner surface.

Specifically, as illustrated in FIG. 25, detection section 545 has a laminate structure in which a plurality of layers are laminated. Specifically, detection section 545 has outer plate-like member 555, insulating layer 556*a*, substrate 551 (first substrate 551*a*, insulating layer 556*b*, second substrate 551*b*), insulating layer 556*c*, second ground portion 552, insulating layer 556*d*, detection pad 553, insulating layer 556*e*, and conductive plate 548 in order from the outside in the width direction (the upper side in FIG. 25).

In the present embodiment, outer plate-like member 555, insulating layer 556*a*, first substrate 551*a*, insulating layer 556*b*, second substrate 551*b*, insulating layer 556*c*, second ground portion 552, insulating layer 556*d*, and detection pad 553 constitute detecting laminate 550. Detecting laminate 550 detects a capacitance change that occurs due to the contact between the object and contacted section 542. For example, detection pad 553 is an electrode layer, and by detecting the capacitance change of the electrode layer caused by the contact with contacted section 542, detection pad 553 is connected to a sensing section (not illustrated) that senses the contact with contacted section 542.

Outer plate-like member 555 is plate-like member made of, for example, metal, ceramics, synthetic resin, or the like. Outer plate-like member 555 has through-hole element 557*a* penetrating therethrough from the outer surface to the inner surface. At the peripheral edge of through-hole element 557*a*, outer plate-like member 555 has annular conduction section 558*a* along the peripheral edge. Conduction section 558*a* is made of metal having conductivity, such as gold, silver, or copper.

Conduction section 558*a* has outer conduction section 555*a* (see FIG. 25) disposed on the outer surface of outer plate-like member 555. Outer conduction section 555*a* abuts on the tip surface (the inner end face in the width direction) of outer connection member 501A to be described later. In the present embodiment, the outer diameter of outer conduction section 555*a* is larger than the outer diameter of the tip surface of outer connection member 501A.

With such a configuration, the tip surface of outer connection member 501A reliably abuts on outer conduction section 555*a*. As a result, electrical connection is reliably made between outer connection member 501A and conduction section 558*a*. On the other hand, in conduction section 558*a*, a portion disposed on the inner surface of outer plate-like member 555 is continued to conduction section 558*b* of insulating layer 556*a*.

Each of insulating layers 556*a* to 556*e* is made of an insulator. Insulating layers 556*a* to 556*e* may have a single-layer structure or a laminated structure. Examples of a material for each of insulating layers 556*a* to 556*e* include silicon dioxide and silicon nitride. Insulating layers 556*a* to 556*e* respectively have through-hole elements 557*b* to 557*f* penetrating therethrough in the width direction.

At the peripheral edges of through-hole elements 557*b* to 557*f*, insulating layers 556*a* to 556*e* have annular conduction sections 558*b* to 558*f* along the peripheral edges. Conduction sections 558*b* to 558*f* are made of metal having conductivity, such as gold, silver, or copper.

Substrate 551 has first substrate 551*a*, insulating layer 556*b*, and second substrate 551*b* in order from the outside in the width direction. Such substrate 551 supports each element constituting detection section 545. Substrate 551 is, for example, a printed circuit board on which control section 160 (see FIG. 2) is mounted. In the case of the present embodiment as well, control section 160 is connected to detection pad 553 so as to receive results of detection of a capacitance change in detection pad 553.

In the present embodiment, in detection section 545, substrate 551 is disposed outside in the width direction (the upper side in FIG. 25) from conductive plate 548, insulating layer 556*e*, and detection pad 553.

First substrate 551*a* and second substrate 551*b* respectively have through-hole elements 557*g*, 557*h* penetrating therethrough in the width direction. At the peripheral edges of through-hole elements 557*g*, 557*h*, first substrate 551*a* and second substrate 551*b* respectively have annular conduction section 558*g*, 558*h* along the peripheral edges. Each of conduction section 558*g*, 558*h* is made of metal having conductivity, such as gold, silver, or copper.

Second ground portion 552 is disposed between substrate 551 and detection pad 553 via insulating layers 556*c*, 556*d*. Second ground portion 552 protects detection pad 553 from noise. This can prevent an unexpected capacitance change. In the case of the present embodiment as well, from the viewpoint of reducing a parasitic capacitance between detection pad 553 and second ground portion 552, second ground portion 552 preferably has the shape of mesh.

Second ground portion 552 has through-hole element 557*i* penetrating therethrough in the width direction. At the peripheral edge of through-hole element 557*i*, second ground portion 552 has annular conduction section 558*i* along the peripheral edge. Conduction section 558*i* is made of metal having conductivity, such as gold, silver, or copper.

Similarly to Embodiment 1 described above, detection pad 553 is a capacitive detection pad that detects a capacitance change caused by contact between the object and contacted section 542. As detection pad 553, a known detection pad usable as a touch sensor can be used.

Detection pad 553 has through-hole element 557*j* penetrating therethrough in the width direction. At the peripheral edge of through-hole element 557*j*, detection pad 553 has annular conduction section 558*j* along the peripheral edge. Conduction section 558*j* is made of metal having conductivity, such as gold, silver, or copper. In detection pad 553, conduction section 558*j* is not connected to detection region 553*a* (see FIG. 25) present on the periphery of conduction section 558*j*.

Conductive plate 548 is disposed on the inner surface of insulating layer 556*e* in the width direction. Specifically, conductive plate 548 is disposed so as to face detection region 553*a* of detection pad 553 with insulating layer 556*e* placed therebetween. In the present embodiment, conductive plate 548 is disposed in a position more distant from contacted section 542 than detecting laminate 550 (specifically, detection pad 553).

Conductive plate 548 has through-hole element 557*k* penetrating therethrough in the width direction. At the peripheral edge of through-hole element 557*k*, conductive plate 548 has annular conduction section 558*k* along the peripheral edge. Conduction section 558*k* is made of metal having conductivity, such as gold, silver, or copper.

Conduction section 558*k* has inner conduction section 548*a* (see FIG. 25) disposed on the inner surface of conductive plate 548 in the width direction. Inner conduction section 548*a* abuts on head 501*b* of inner connection member 501B (also referred to as a grasping section; see FIG. 22).

In the present embodiment, the outer diameter of inner conduction section 548*a* is larger than the outer diameter of head 501*b* of inner connection member 501B. With this configuration, head 501*b* of inner connection member 501B reliably abuts on inner conduction section 548*a*. As a result, electrical connection is reliably made between inner connection member 501B and conduction section 558*k*.

In a state where the respective members constituting detection section 545 as described above are laminated in the width direction, the central axes of through-hole elements 557*a* to 557*k* are located on the same axis. Through-hole elements 557*a* to 557*k* constitute through hole 557A of detection section 545.

Such through hole 557A penetrates detection section 545 from the outer surface (also referred to as a first surface) thereof to the inner surface (also referred to as a second surface) thereof. In the present embodiment, the outer surface of detection section 545 is the outer surface of outer plate-like member 555. Meanwhile, the inner surface of detection section 545 is the inner surface of conductive plate 548.

The conduction sections that are adjacent in the width direction among conduction sections 558A to 558K are electrically connected to each other. In this manner, electrical connection is made between conduction section 558*a* disposed on the outermost side in the width direction and conduction section 558*k* disposed on the innermost side in the width direction. Conduction sections 558A to 558K constitute conduction section 558A of detection section 545.

4) Connection Member

Connection member 501 has conductivity and electrically connects between contacted section 542 and detection section 545. Connection member 501 fixes contacted section 542 and substrate 551 of detection section 545. In the present embodiment, contacted section 542 and detection section 545 are electrically connected via a first conduction path and a second conduction path to be described later.

Specifically, connection member 501 has outer connection member 501A and inner connection member 501B. Outer connection member 501A is a fastening part such as a nut and provided on the inner surface of contacted section 542. Outer connection member 501A is a cylindrical member with its tip side (the lower side in FIG. 22) opened, and has female threaded section 501*a* (see FIG. 22) on at least a part of inner peripheral surface.

The base end (the top end in FIG. 22) of outer connection member 501A is integrally fixed to the inner surface of contacted section 542. Such outer connection member 501A is inserted into outer through hole 541*g* of casing 541 from the outside in the width direction.

In this state, the tip surface of outer connection member 501A abuts on a first end (the outer end in the width direction, and the upper end in FIG. 22) of conduction section 558A of detection section 545. Specifically, the tip surface of outer connection member 501A abuts on outer conduction section 555*a* of outer plate-like member 555 in detection section 545.

Inner connection member 501B is a fastening part such as a screw or a bolt. Inner connection member 501B has head 501*b* and axial portion 501*c*. Head 501*b* has engagement portion 501*d*, with which a tool such as a driver or a hex wrench can be engaged, on one end face in the axial direction (the lower end face in FIG. 22).

The outer shape of head 501*b* is a circular shape, for example. The outer shape of head 501*b* may be a polygonal shape such as a hexagonal shape. In this case, engagement portion 501*d* of head 501*b* may be omitted.

Axial portion 501*c* is a solid axial member and has male threaded section 501*e* (see FIG. 22) on the outer peripheral surface. Axial portion 501*c* has an outer diameter small enough to be inserted into through hole 557A of detection section 545. Such axial portion 501*c* is inserted into through hole 557A of detection section 545 from the inside in the width direction.

In this state, male threaded section 501e of axial portion 501c is engaged with female threaded section 501a of outer connection member 501A. Thereby, outer connection member 501A and inner connection member 501B are fastened and connected electrically.

With outer connection member 501A and inner connection member 501B in the fastened state, head 501b of inner connection member 501B abuts on a second end (the inner end in the width direction, and the lower end in FIG. 22) of conduction section 558A of detection section 545. Specifically, head 501b of inner connection member 501B abuts on inner conduction section 548a of conductive plate 548 in detection section 545, from the inside in the width direction.

As described above, outer connection member 501A abuts on the first end of conduction section 558A of detection section 545 and inner connection member 501B abuts on the second end of conduction section 558A of detection section 545, whereby contacted section 542 and conductive plate 548 of detection section 545 are conducted by the first conduction path and the second conduction path to be described below.

In the present embodiment, conductive plate 548 is electrically connected to contacted section 542 via the first conduction path on the outer surface (also referred to as a first main surface) side. Meanwhile, conductive plate 548 is electrically connected to contacted section 542 via the second conduction path on the inner surface (also referred to as a second main surface) side.

The first conduction path is a path that connects between contacted section 542 and conductive plate 548 of detection section 545 via through hole 557A. Specifically, first conduction path is made up of contacted section 542, outer connection member 501A, conduction section 558A of detection section 545, and conductive plate 548, in the order presented.

Meanwhile, the second conduction path is a path that connects between contacted section 542 and conductive plate 548 of detection section 545 via connection member 501 (specifically, the engagement section of outer connection member 501A and inner connection member 501B). Specifically, second conduction path is made up of contacted section 542, outer connection member 501A, inner connection member 501B, and conductive plate 548, in the order presented.

5) Light Source

Light source 502 (see FIG. 22) emits light in a light emission pattern corresponding to the state of electronic glasses 100. Light source 502 emits light (is turned on) in a state where electronic glasses 100 are being operated (on-state), and is turned off in a state where electronic glasses 100 are not operated (off-state).

Light source 502 is, for example, a light emitting diode (LED). Such light source 502 is supported on substrate 551. Specifically, in the present embodiment, light source 502 is provided in a position of the inner surface (the bottom surface in FIG. 22) of substrate 551, the position overlapping in the width direction with first inner through hole 541i of casing 541.

6) Conductive Member

Light guiding member 503 has optical transparency and guides the light from light source 502 to the outside of casing 541. That is, the user and the like can view the light from light source 502 from the outside via light guiding member 503. Such light guiding member 503 is made of resin such as acryl, polycarbonate, polystyrene, and a composite material of these.

Figure 23:
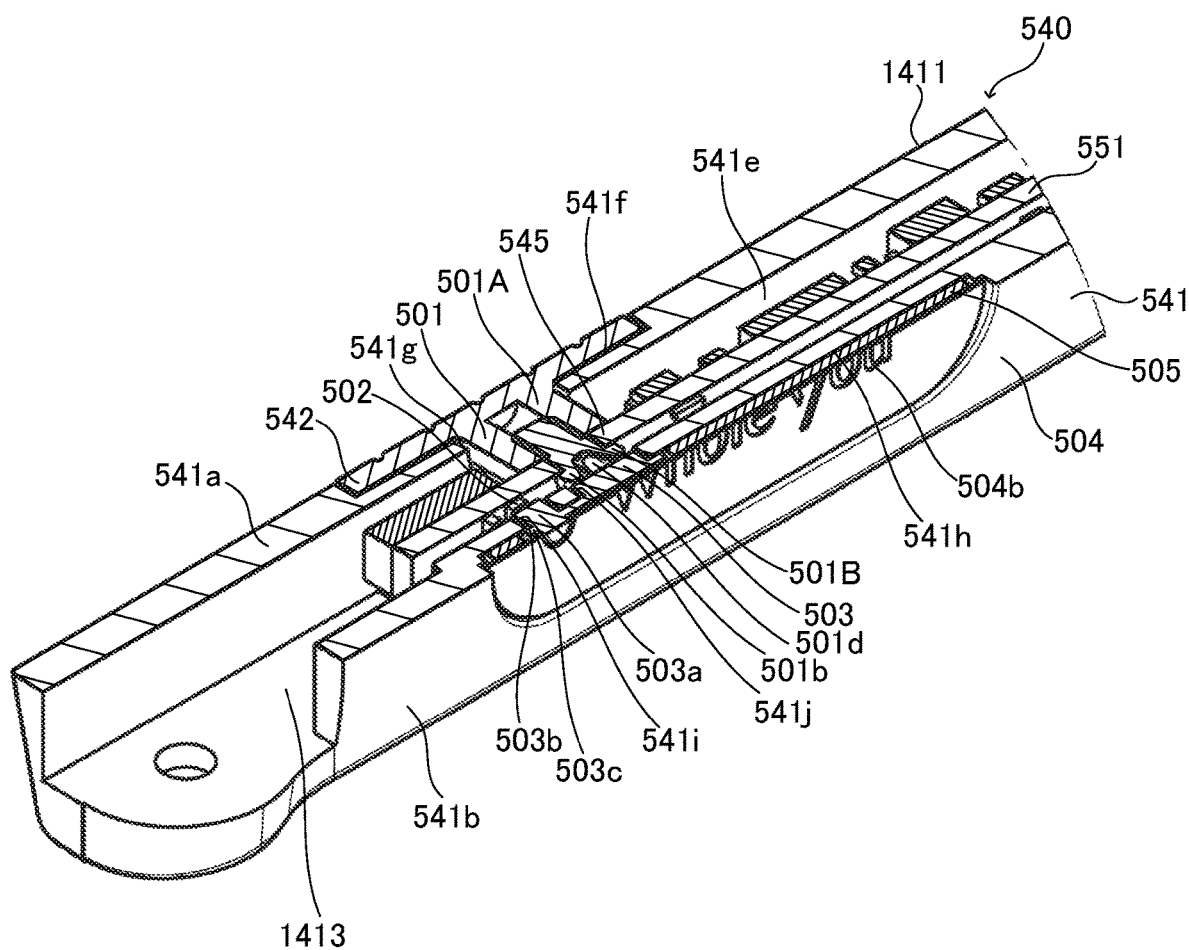
FIG. 23 is a sectional perspective view of the portion corresponding to the portion X in FIG. 20.
Figure 24A:
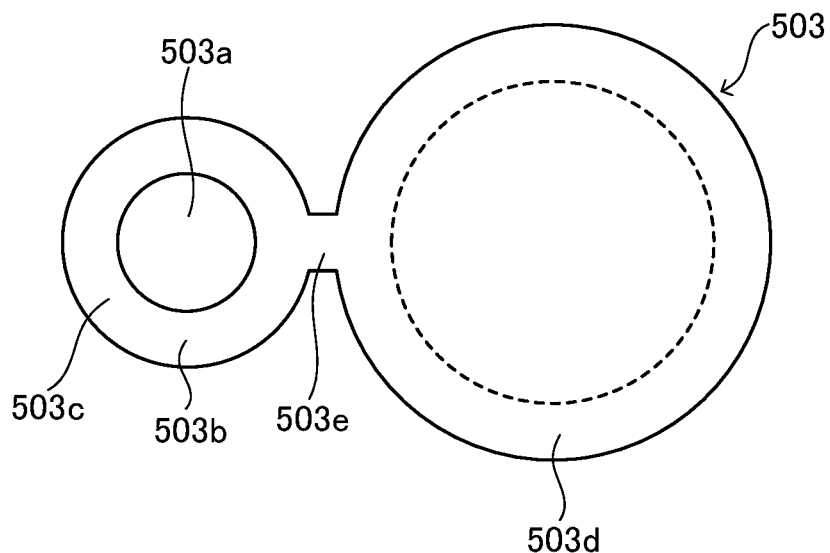
FIG. 24A is a plan view of a light guide body.
Figure 24B:
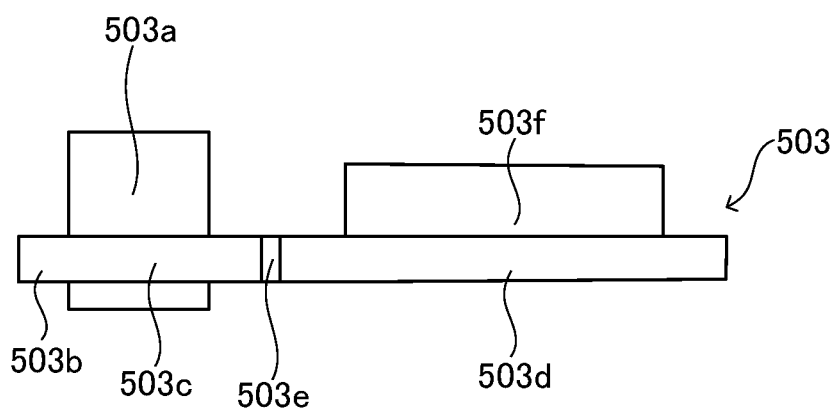
FIG. 24B is a side view of the light guide body.

Specifically, as illustrated in FIGS. 22 to 24, light guiding member 503 has light guiding body 503a, support section 503b, and positioning protrusion 503f. Light guiding body 503a is a portion that guides the light from light source 502 to the outside of casing 541 and has a solid cylindrical shape. Light guiding body 503a is disposed such that its axial direction coincides with the width direction of electronic glasses 100 in an opened state (the state illustrated in FIG. 1).

A first end (the lower end in FIG. 22, and also referred to as one end in the axial direction) of light guiding body 503a is disposed in exposure through hole 504a of side cover 504. The first end face (the lower end face in FIG. 22) of light guiding body 503a is exposed to the outside from exposure through hole 504a of side cover 504 to be described later.

Meanwhile, a second end (the upper end in FIG. 22, and also referred to as the other end in the axial direction) of light guiding body 503a is inserted into first inner through hole 541i of inner recess 541h in casing 541.

In this state, the second end face (the upper end face in FIG. 22) of light guiding body 503a faces light source 502. The light from light source 502 is incident on light guiding body 503a from the second end face of light guiding body 503a and goes outside from the first end face of light guiding body 503a.

Support section 503b supports light guiding body 503a with respect to casing 541. Support section 503b is a plate-like member and provided on the outer peripheral surface of light guiding body 503a. Such support section 503b is disposed in inner recess 541h of casing 541. Specifically, support section 503b has first covering section 503c, second covering section 503d, and continuous section 503e.

First covering section 503c extends from the outer peripheral surface of light guiding body 503a to the outer side in the radial direction of light guiding body 503a. Specifically, first covering section 503c is a ring-shaped plate member and has an outer diameter larger than the outer diameter of first inner through hole 541i. The inner peripheral edge of first covering section 503c is integrally fixed to the outer peripheral surface of light guiding body 503a.

Such first covering section 503c abuts on the periphery of first inner through hole 541i at the bottom of inner recess 541h. First covering section 503c thus covers a first opening (the lower opening in FIG. 22) of a clearance (specifically, a cylindrical clearance) between the inner peripheral surface of first inner through hole 541i and the outer peripheral surface of light guiding body 503a.

In the present embodiment, first covering section 503c closes the whole circumference of the first opening of the clearance. Thereby, a liquid such as water hardly enters first inner through hole 541i from the outside.

Second covering section 503d is continued to first covering section 503c via continuous section 503e. Second covering section 503d is a disk-shaped plate member and has an outer diameter larger than the outer diameter of second inner through hole 541j.

Such second covering section 503d covers the first opening (the lower opening in FIG. 22) of second inner through hole 541j. In the present embodiment, second covering section 503d closes the entire first opening of second inner through hole 541j. Thereby, a liquid such as water hardly enters second inner through hole 541j from the outside.

Positioning protrusion 503f is integrally provided on the outer surface (the top surface in FIG. 22) of second covering section 503d. Positioning protrusion 503f is a solid cylindrical member and protrudes from the outer surface of second covering section 503d.

Positioning protrusion 503f has an inner diameter slightly smaller than the inner diameter of second inner through hole 541j. Such positioning protrusion 503f is inserted into second inner through hole 541j. The rotational movement of Light guiding member 503 is prevented by engagement between positioning protrusion 503f and second inner through hole 541j.

7) Side Cover

Side cover 504 is a plate-like member having a light blocking effect. Side cover 504 has exposure through hole 504a (also referred to as a light transmissive section) that exposes the first end face (the lower end face in FIG. 22) of light guiding body 503a to the outside. In casing 541, exposure through hole 504a is provided in a position overlapping first inner through hole 541i in the width direction. Note that a light transmissive section is not limited to the through hole of the present embodiment so long as allowing passage of light guided by light guiding member 503. For example, the light transmissive section may be a member having translucency (for example, a resin member having translucency), provided in a part of side cover 504.

Such side cover 504 is disposed on the inside in the width direction (the lower side in FIG. 22) from support section 503b of light guiding member 503 in inner recess 541h of casing 541. Side cover 504 may be fixed to inner recess 541h of casing 541 by adhesive member 505 to be described later.

In this state, the first end (the lower end in FIG. 22) of light guiding body 503a is inserted into exposure through hole 504a. In this manner, the first end face of light guiding body 503a is exposed to the outside via exposure through hole 504a.

Identification information 504b (see FIGS. 16 and 17B) such as a logo mark is added to the inner surface of side cover 504. Identification information 504b is formed on the inner surface of side cover 504 by, for example, laser processing, marking, printing, or the like. The inner surface of side cover 504 is present on the same plane as the inner side surface of casing 541 (specifically, inner wall 541b).

8) Adhesive Member

Adhesive member 505 is disposed between the bottom of inner recess 541h of casing 541 and side cover 504 to fix side cover 504 to the bottom of inner recess 541h. Adhesive member 505 is, for example, a double-sided tape, and has storage section 505a (see FIGS. 16 and 22) in which support section 503b of light guiding member 503 can be disposed.

In the present embodiment, storage section 505a is a through hole. Storage section 505a has a size large enough to accept second inner through hole 541j of casing 541, first inner through hole 541i of casing 541, and exposure through hole 504a of side cover 504, on the inside of the outer peripheral edge of storage section 505a as seen from the width direction. In other words, in the width direction, storage section 505a overlaps each of second inner through hole 541j, first inner through hole 541i, and exposure through hole 504a. The shape of storage section 505a is not particularly limited so long as being a shape in which support section 503b of light guiding member 503 can be disposed. Support section 503b of light guiding member 503 is disposed in storage section 505a as thus described.

9) Front-End Cover

Front-end cover 546 (see FIGS. 16 and 19) is disposed so as to cover second opening 1413 of temple 540 at the front end of temple 540. Such front-end cover 546 is a box-shaped member with its rear end side opened.

Specifically, front-end cover 546 has front wall 546e that closes tubular portion 546A having a rectangular cross section and the front opening of tubular portion 546A. Tubular portion 546A is made up of first wall 546a and second wall 546b that face the width direction, and third wall 546c and fourth wall 546d that face the vertical direction.

Figure 21:
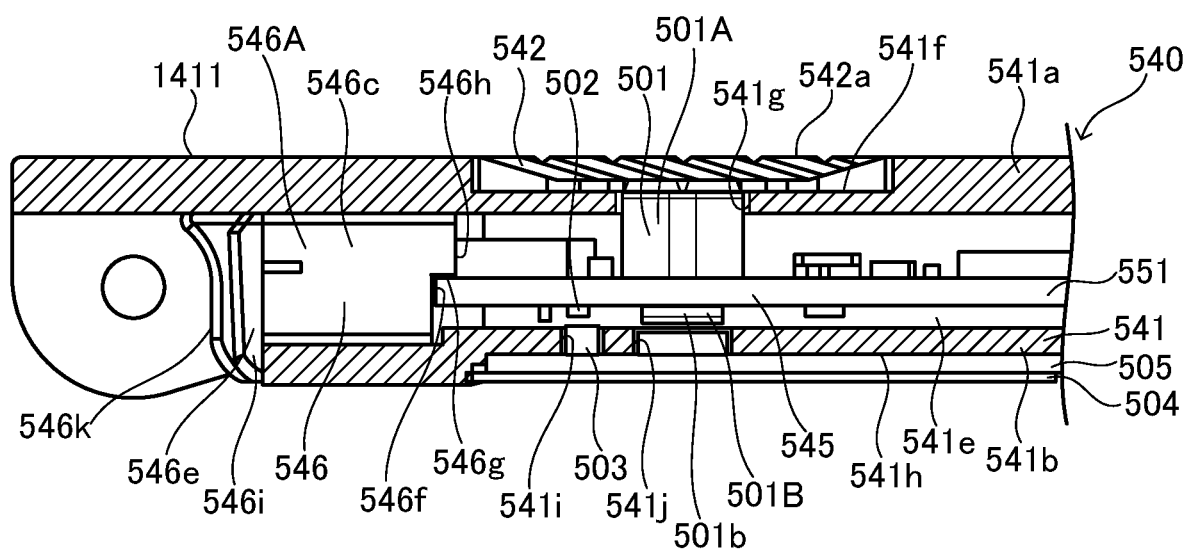
FIG. 21 is an enlarged view of a portion X in FIG. 20.

Each of third wall 546c and fourth wall 546d has, on the rear end face, positioning recess 546f, positioning step 546g, and positioning protrusion 546h in order from the inside in the width direction (the lower side in FIGS. 21, 22).

Tubular portion 546A is inserted into second opening 1413 of temple 540 in an assembled state (the state illustrated in FIGS. 21 and 22). In this state, the front end of substrate 551 abuts on positioning recess 546f and positioning step 546g.

In this manner, the forward positioning and outward positioning of substrate 551 in the width direction are performed. Note that the rearward positioning of substrate 551 is performed by engagement between the rear end of substrate 551 and the inside surface of casing 541. Further, the inward positioning of substrate 551 in the width direction is performed by engagement between contacted section 542, fixed to substrate 551 via connection member 501, and outer recess 541f of casing 541.

Front wall 546e has positioning flange 546i extending inward in the width direction from tubular portion 546A (specifically, second wall 546b). Such positioning flange 546i abuts on the front end on inner wall 541b of casing 541.

The rearward positioning of front-end cover 546 with respect to casing 541 is thereby performed. Note that the positioning of front-end cover 546 in the width and vertical directions is performed by engagement between tubular portion 546A and the inside surface of casing 541.

Front wall 546e has through hole 546j for a flexible printed circuit (FPC) that allows insertion of FPC 507 (see FIGS. 16 and 19) connected to substrate 551. Further, front wall 546e has, on the front-side surface, guide surface 546k that is smoothly inclined rearward from the outside to the inside in the width direction.

Guide surface 546K guides temple 540 for smooth rotational movement with respect to each end of front 130 in the width direction. Guide surface 546K is formed by combination of curves and straight lines. Such a shape of guide surface 546K is determined as appropriate corresponding to the shapes of each end of front 130 in the width direction.

10) Temple Assembly Method

Hereinafter, an assembly procedure for temple 540 will be described. First, as illustrated in FIG. 26A, substrate 551 is inserted from second opening 1413 of casing 541 into storage space 541e. At this time, the short-directional end (specifically, the vertical end) of substrate 551 is engaged with first guide groove 541k and second guide groove 541m of casing 541 to guide insertion of substrate 551.

Next, contacted section 542 is disposed in outer recess 541f of casing 541. At this time, outer connection member 501A provided integrally with contacted section 542 is inserted into outer through hole 541g of casing 541. Next, inner connection member 501B is led into storage space 541e from second inner through hole 541j in casing 541.

Next, axial portion 501c of inner connection member 501B is inserted into through hole 557A of detection section 545. Then, male threaded section 501e of inner connection member 501B is engaged (screwed) with female threaded section 501a of outer connection member 501A. At this time, inner connection member 501B is rotated using a tool (not illustrated) such as a driver led into storage space 541e from second inner through hole 541j in casing 541.

Subsequently, light guiding body 503a of light guiding member 503 is inserted into first inner through hole 541i of casing 541, and positioning protrusion 503f of light guiding member 503 is inserted into second inner through hole 541j of casing 541. In this state, first covering section 503c of light guiding member 503 covers the entire first opening (the lower opening in FIG. 22) of the clearance between the inner peripheral surface of first inner through hole 541i of casing 541 and the outer peripheral surface of light guiding body 503a.

Meanwhile, in the state described above, second covering section 503d of light guiding member 503 covers the entire first opening (the lower opening in FIG. 22) of second inner through hole 541j. Next, adhesive member 505 is caused to adhere to the bottom of inner recess 541h of casing 541. In this state (the state illustrated in FIG. 27A), support section 503b of light guiding member 503 is disposed inside storage section 505a of adhesive member 505.

Then, side cover 504 is bonded to adhesive member 505 so as to be disposed in inner recess 541h of casing 541. In this state (the state illustrated in FIG. 27B), the first end face in the axial direction (the lower end face in FIG. 22) of light guiding body 503a is disposed in exposure through hole 504a of side cover 504.

(Effects)

The electronic glasses, the frame, and temple 540 according to Embodiment 5 also have similar effects to those of Embodiment 1. Further, in the case of Embodiment 5, even when a structure is formed where substrate 551 is disposed between conductive plate 548 and contacted section 542, conductive plate 548 and contacted section 542 can be electrically connected by connection member 501.

Especially in the case of the present embodiment, conductive plate 548 and contacted section 542 are electrically connected by two paths being the first conduction path and the second conduction path. This enables stable detection of the contact of the object with contacted section 542. As a result, it is possible to ensure the stability of the operation of the electronic glasses.

APPENDIX

The summary of the sensor module according to the present invention as described above includes: a casing; a contacted section that has conductivity and is disposed such that at least a part of the contacted section is exposed to an outside of the casing; and a detection section that has a capacitive detection pad and is disposed inside the casing, and in the sensor module, the contacted section is connected to the detection section so that a capacitance change caused by contact with the object occurs in the detection pad.

In Embodiments 1 to 4 above, detection section 145 having detecting laminate 150, insulating layer 147, conductive plate 148, and first ground portion 149 has been described, but the detection section of the sensor module according to the present invention does not need to have insulating layer 147, conductive plate 148, or first ground portion 149. In this case, the contacted section and the detection pad in the detection section are connected directly or electrically to each other via an elastic member.

In Embodiments 1 to 4 above, the electronic glasses having the pair of temples according to the present invention have been described, but the frame and the eyewear according to the present invention are not limited to this aspect. For example, one temple may be made up only of a casing.

In Embodiments 1 to 4 above, the electronic glasses have been described as the eyewear, but the eyewear according to the present invention is not limited to the electronic glasses. Other examples of the eyewear include sunglasses and goggles.

The entire disclosure of the specification, drawings, and abstract included in Japanese Application No. 2016-253272 filed Dec. 27, 2016 is hereby incorporated.

INDUSTRIAL APPLICABILITY

The sensor module of the present invention has excellent operability and high sensitivity for contact with an object, and is thus useful for electronic equipment having a capacitive detection pad. For example, the sensor module of the present invention can be favorably used for temples for eyewear, a frame, and eyewear.

REFERENCE SIGNS LIST

100 Electronic glasses (eyewear)
110 Lens
1101 First region (electroactive region)
1102 Second region
111 First substrate
112 First electrode
113 Liquid crystal layer
114 Second electrode
115 Second substrate
116 Adhesive layer
117 Diffraction region
1171 Protrusion
1172 First protruding strip
120 Frame
130 Front
131 Rim
132 Bridge
133 Nose pad
140, 240, 340, 440, 540 Temple
141, 441, 541 Casing
541a Outer wall
541b Inner wall
541c Upper wall
541d Lower wall
541e Storage space
541f Outer recess
541g Outer through hole
541h Inner recess
541i First inner through hole
541j Second inner through hole
541k First guide groove
541m Second guide groove
541n Parallel groove
541p Inclined groove
1411 Second protruding strip
1412 first opening
1413 second opening
142, 242, 342, 542 Contacted section
542a Contacted-section-side protruding strip
1421 Exposed portion
2421 Recess
1422, 2422 Stored portion
3423 Fixed portion
143, 443 Spacer
1431 Through hole
144, 244 Elastic member
145, 545 Detection section 146, 546 Front-end cover
546A Tubular portion
546a First wall
546b Second wall
546c Third wall
546d Fourth wall
546e Front wall
546f Positioning recess
546g Positioning step
546h Positioning protrusion
546i Positioning flange
546j Through hole for FPC
546k Guide surface
147 Insulating layer
148, 548 Conductive plate
548a Inner conduction section
149 First ground portion
150, 550 Detecting laminate
151, 551 Substrate
551a First substrate
551b Second substrate
152, 552 Second ground portion
153, 553 Detection pad
553a Detection region
154 Third ground section
555 Outer plate-like member
555a Outer conduction section
556a to 556e Insulating layer
557A Through hole
557a to 557k Through-hole element
558A Conduction section
558a to 558k Conduction section
160 Control section
170 Power source
501 Connection member
501A Outer connection member
501B Inner connection member
501a Female threaded section
501b Head
501c Axial portion
501d Engagement portion
501e Male threaded section
502 Light source
503 Light guiding member
503a Light guiding body
503b Support section
503c First covering section
503d Second covering section
503e Continuous section
503f Positioning protrusion
504 Side cover
504a Exposure through hole
504b Identification information
505 Adhesive member
505a Storage section
507 FPC

What is claimed is:

1. A sensor module, comprising:
a casing;
a contacted section that has conductivity and is disposed such that at least a part of the contacted section is exposed to an outside of the casing; and
a detection section that includes a capacitive detection pad and is disposed inside the casing, wherein:
the detection section further includes:
a insulating layer disposed on a detection region of the detection pad;
a conductive plate provided corresponding to the detection region and disposed on the insulating layer; and
a through hole, and
the contacted section and the conductive plate are electrically connected to each other by a first conduction path via the through hole.

2. The sensor module according to claim 1, wherein:
the detection pad, the insulating layer, and the conductive plate respectively include through-hole elements constituting the through hole, and
conduction sections constituting the first conduction path are formed on peripheries of the through-hole elements, respectively.

3. The sensor module according to claim 1, further comprising a connection member inserted in the through hole, wherein
the contacted section and the conductive plate are electrically connected to each other by a second conduction path via the connection member.

4. The sensor module according to claim 3, wherein the detection section is held between the contacted section and a grasping section of the connection member.

5. The sensor module according to claim 3, wherein:
the conductive plate includes a first main surface and a second main surface facing the first main surface in a predetermined direction, and
the conductive plate is connected to the contacted section via the first conduction path on the first main surface side, and the conductive plate is connected to the contacted section via the second conduction path on the second main surface side.

6. The sensor module according to claim 1, further comprising, an elastic member that has conductivity and is disposed so as to urge the contacted section to an outside of the casing between the contacted section and the detection section, wherein
the contacted section is connected to the detection section via the elastic member.

7. The sensor module according to claim 6, further comprising, a spacer disposed between the contacted section and the detection section.

8. The sensor module according to claim 7, wherein:
a through hole is formed in the spacer, and
at least a part of the elastic member is disposed in the through hole.

9. The sensor module according to claim 6, wherein:
a recess is formed on a surface of the contacted section, the surface being located inside the casing, and
at least a part of the elastic member is disposed in the recess.

10. The sensor module according to claim 6, wherein the elastic member is a flat spring or a coil spring.

11. The sensor module according to claim 6, wherein the elastic member abuts on a center portion of the contacted section.

12. The sensor module according to claim 1, wherein:
the contacted section includes a holding section for holding a position of the contacted section, and
the holding section has elasticity in a direction to the outside of the casing.

13. The sensor module according to claim 1, wherein the number of the contacted sections is larger than one, and the plurality of contacted sections are each connected to the detection section so that a capacitance change caused by contact with an object occurs in the detection pad.

14. A temple for eyewear, comprising the sensor module according to claim 1, wherein:
the casing constitutes an outer shape of the temple, and
at least a part of the contacted section is disposed so as to be exposed to an outside of the temple.

15. The temple according to claim 14, wherein a length of the contacted section in the longitudinal direction is smaller than a length of the detection region of the detection pad in the longitudinal direction.

16. The temple according to claim 14, wherein:
a protruding strip extending along a longitudinal direction of the casing is formed in the casing, and
the contacted section is disposed on an extension line of a ridge of the protruding strip.

17. The temple according to claim 14, further comprising, a front-end cover disposed at a front end, wherein:
in the casing, an opening is formed at the front end in the longitudinal direction of the casing, and
the front-end cover abuts on one end of the detection section in the longitudinal direction and is disposed so as to cover the opening.

18. A frame for eyewear, comprising:
a front configured to hold a pair of lenses; and
the temple according to claim 14, connected to the front.

19. An eyewear, comprising:
a pair of lenses each including an electroactive region in which an optical characteristic changes by electric control;
the frame according to claim 18, holding the pair of lenses; and
a control section configured to vary the optical characteristic in the electroactive region of each of the pair of lenses by applying a voltage to the pair of lenses or stopping application of the voltage to the pair of lenses when the detection section detects contact of the object with the contacted section.

* * * * *